(12) United States Patent  
Sung et al.

(10) Patent No.: US 11,641,006 B2
(45) Date of Patent: May 2, 2023

(54) SEMICONDUCTOR DEVICE

(71) Applicant: SUZHOU LEKIN SEMICONDUCTOR CO., LTD., Taicang (CN)

(72) Inventors: Youn Joon Sung, Seoul (KR); Min Sung Kim, Seoul (KR)

(73) Assignee: SUZHOU LEKIN SEMICONDUCTOR CO., LTD., Taicang (CN)

(*) Notice: Subject to any disclaimer, the term of this patent is extended or adjusted under 35 U.S.C. 154(b) by 189 days.

(21) Appl. No.: 16/981,762

(22) PCT Filed: Mar. 22, 2019

(86) PCT No.: PCT/KR2019/003348
§ 371 (c)(1),
(2) Date: Sep. 17, 2020

(87) PCT Pub. No.: WO2019/194438
PCT Pub. Date: Oct. 10, 2019

(65) Prior Publication Data
US 2021/0036190 A1 Feb. 4, 2021

(30) Foreign Application Priority Data

Apr. 4, 2018 (KR) .......... 10-2018-0039195

(51) Int. Cl.
H01L 33/38 (2010.01)
H01L 33/10 (2010.01)
H01L 33/62 (2010.01)

(52) U.S. Cl.
CPC ............ *H01L 33/382* (2013.01); *H01L 33/10* (2013.01); *H01L 33/62* (2013.01)

(58) Field of Classification Search
CPC ....... H01L 33/382; H01L 33/10; H01L 33/62; H01L 33/025; H01L 33/32; H01L 33/46; H01L 33/36; H01L 33/14; H01L 33/20
See application file for complete search history.

(56) References Cited

U.S. PATENT DOCUMENTS

2013/0099141 A1* 4/2013 Chua ................. H01L 33/26
                                                          438/47
2014/0219304 A1 8/2014 Lee et al.
(Continued)

FOREIGN PATENT DOCUMENTS

KR 10-2014-0099379 8/2014
KR 10-2016-0093789 8/2016
(Continued)

OTHER PUBLICATIONS

International Search Report dated Jun. 28, 2019 issued in Application No. PCT/KR2019/003348.

*Primary Examiner* — Su C Kim
(74) *Attorney, Agent, or Firm* — Birch, Stewart, Kolasch & Birch, LLP

(57) ABSTRACT

Disclosed in an embodiment is a semiconductor device comprising: a semiconductor structure comprising a first conductive type semiconductor layer, a second conductive type semiconductor layer, and an active layer disposed between the first conductive type semiconductor layer and the second conductive type semiconductor layer; a second electrode electrically connected to the second conductive type semiconductor layer; and a reflective layer disposed under the second electrode, wherein the second conductive type semiconductor layer comprises a first sub-layer and a second sub-layer disposed between the first sub-layer and the active layer and having an aluminum (Al) composition higher than that of the first sub-layer, the reflective layer
(Continued)

comes into contact with the lower surface of the second sub-layer, and the second electrode comes into contact with the first sub-layer.

10 Claims, 20 Drawing Sheets

(56) References Cited

U.S. PATENT DOCUMENTS

| | | | |
|---|---|---|---|
| 2016/0013388 A1* | 1/2016 | Lee | H01L 27/156 |
| | | | 257/13 |
| 2017/0317236 A1 | 11/2017 | Lee et al. | |
| 2018/0033912 A1 | 2/2018 | Bhusat et al. | |
| 2018/0069150 A1 | 3/2018 | Oh et al. | |

FOREIGN PATENT DOCUMENTS

| | | |
|---|---|---|
| KR | 10-2018-0025733 | 3/2018 |
| KR | 10-2018-0029750 | 3/2018 |
| WO | WO 2018/022849 | 2/2018 |

* cited by examiner

[FIG. 1]
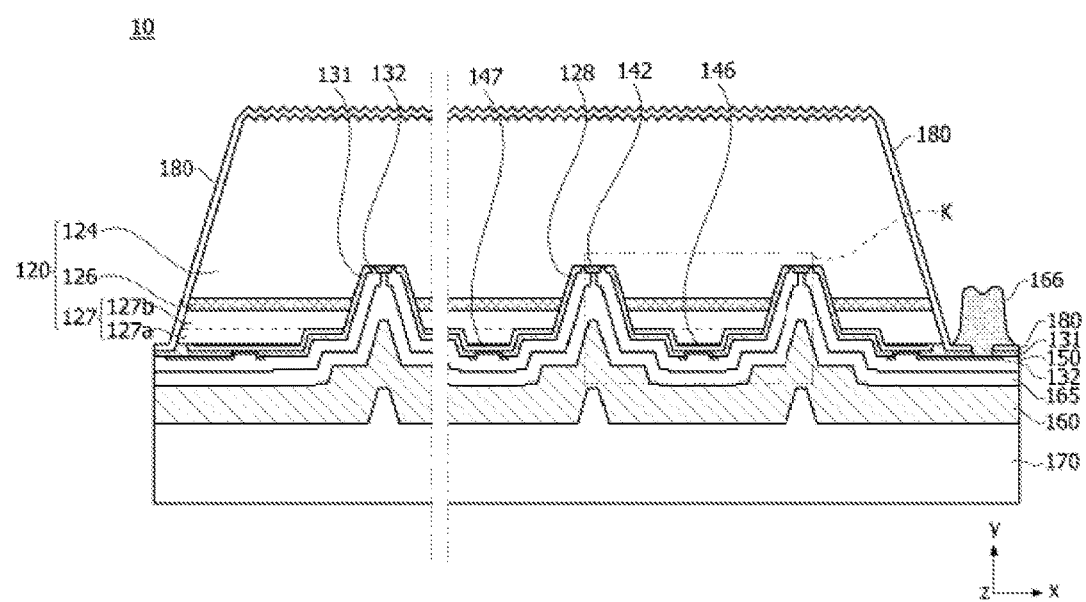

[FIG. 2]
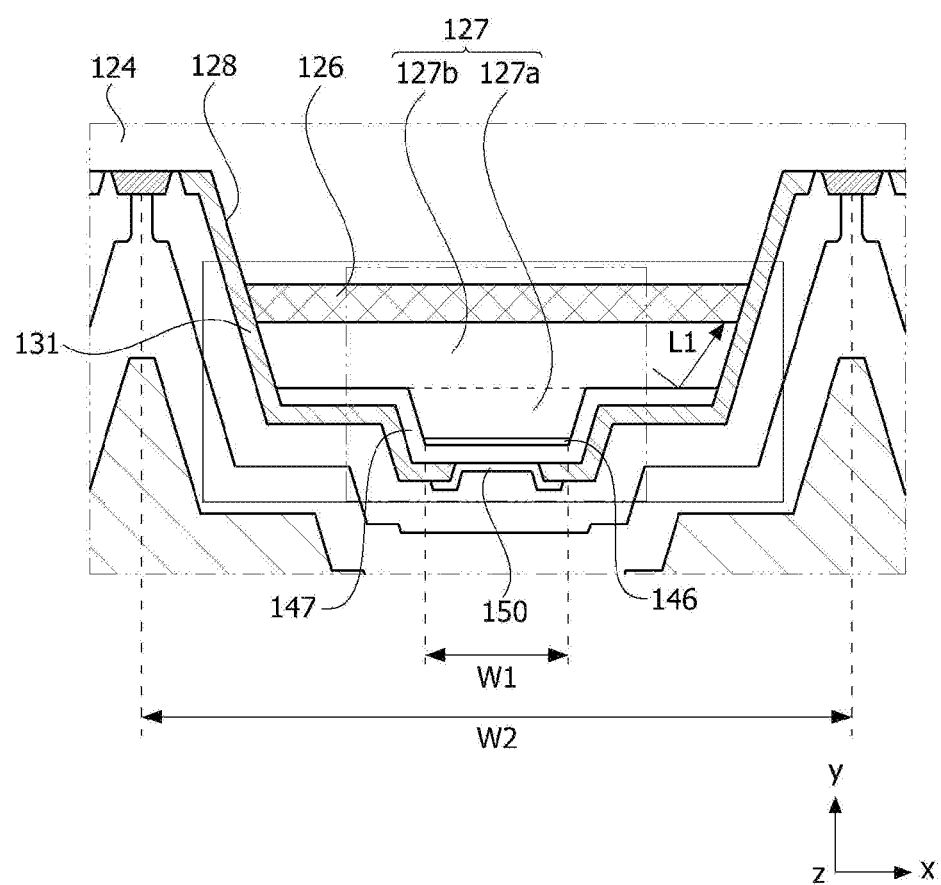

[FIG. 3]
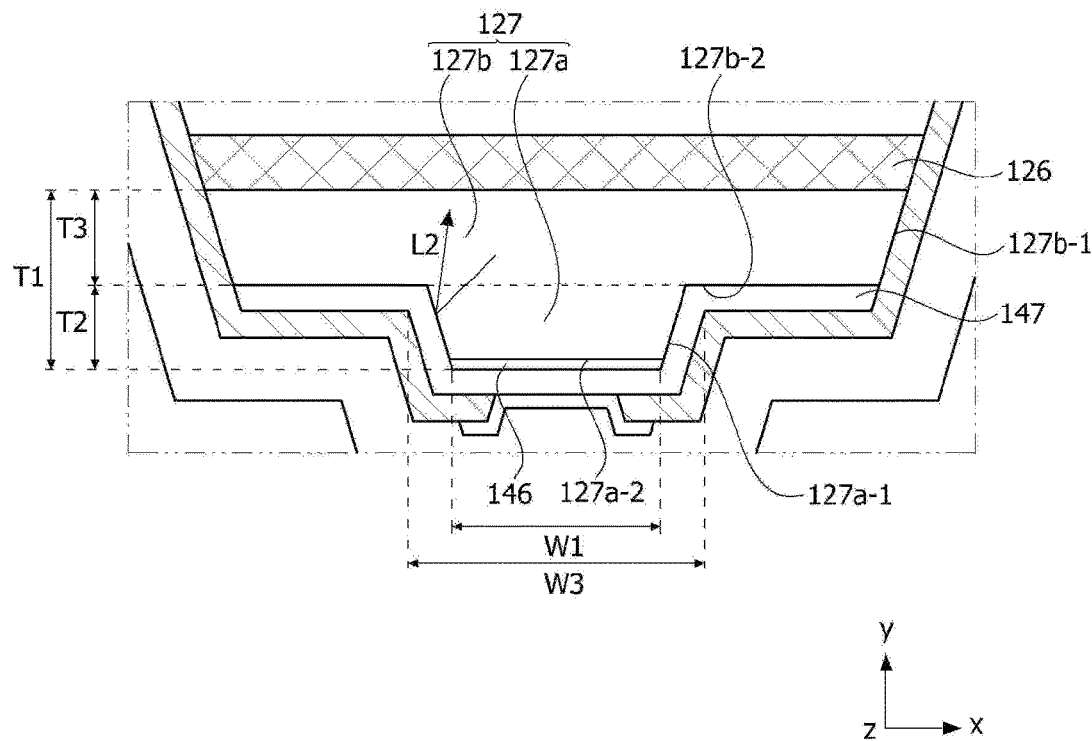
[FIG. 4A]
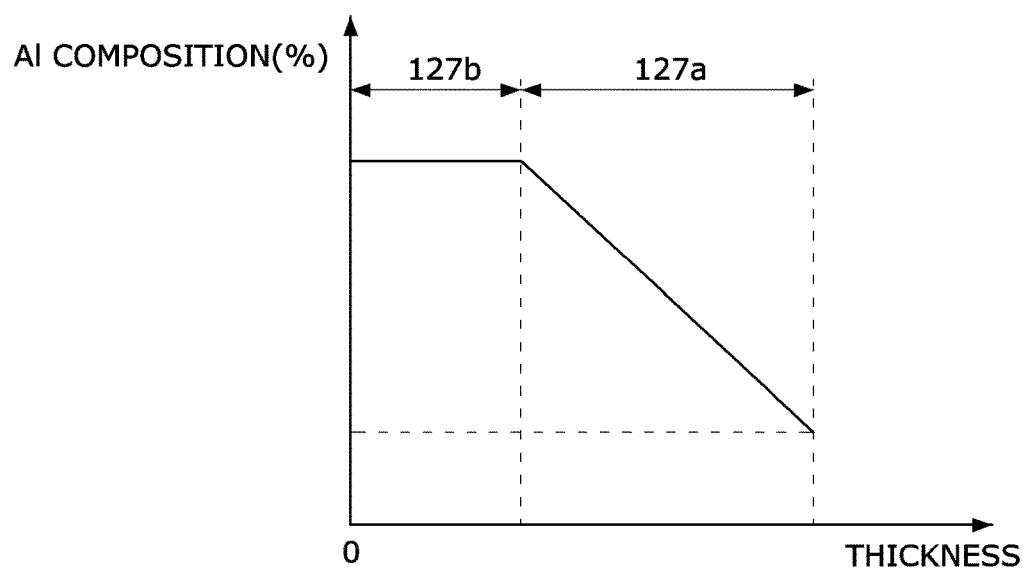

[FIG. 4B]
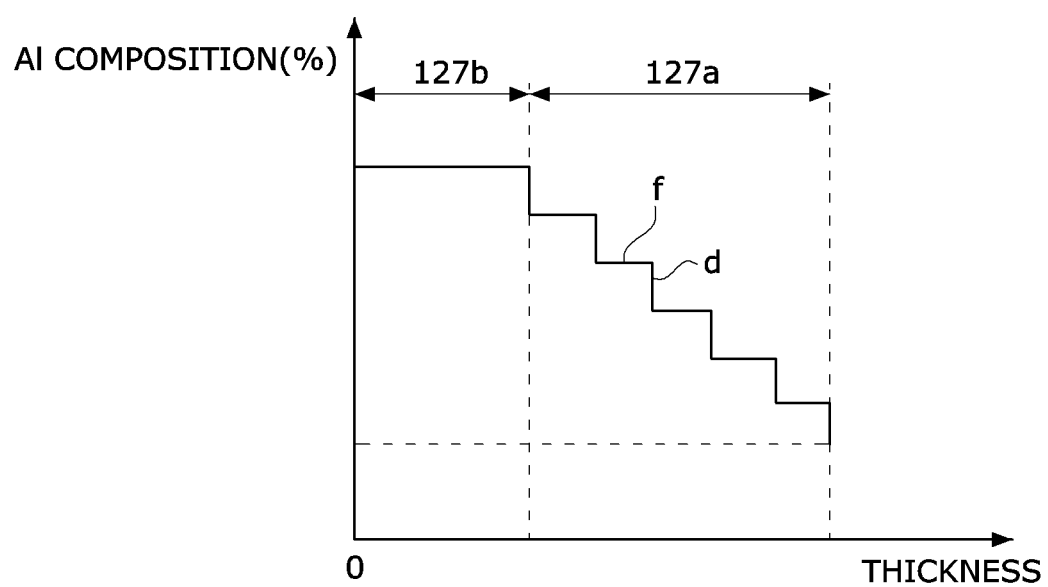

[FIG. 5]
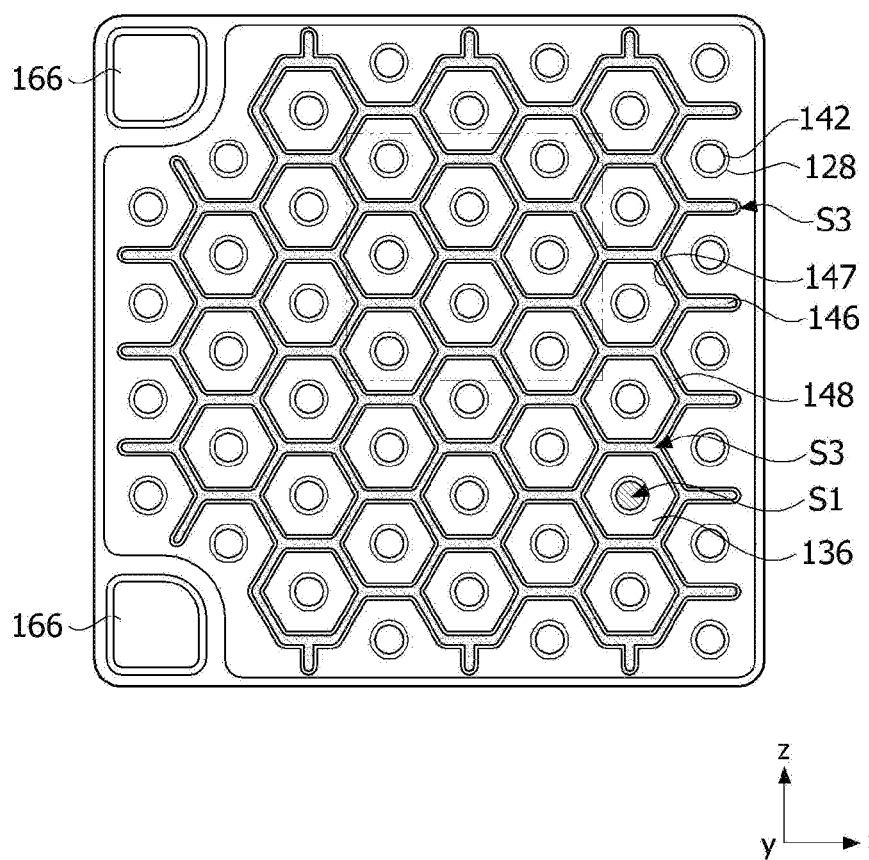

[FIG. 6]
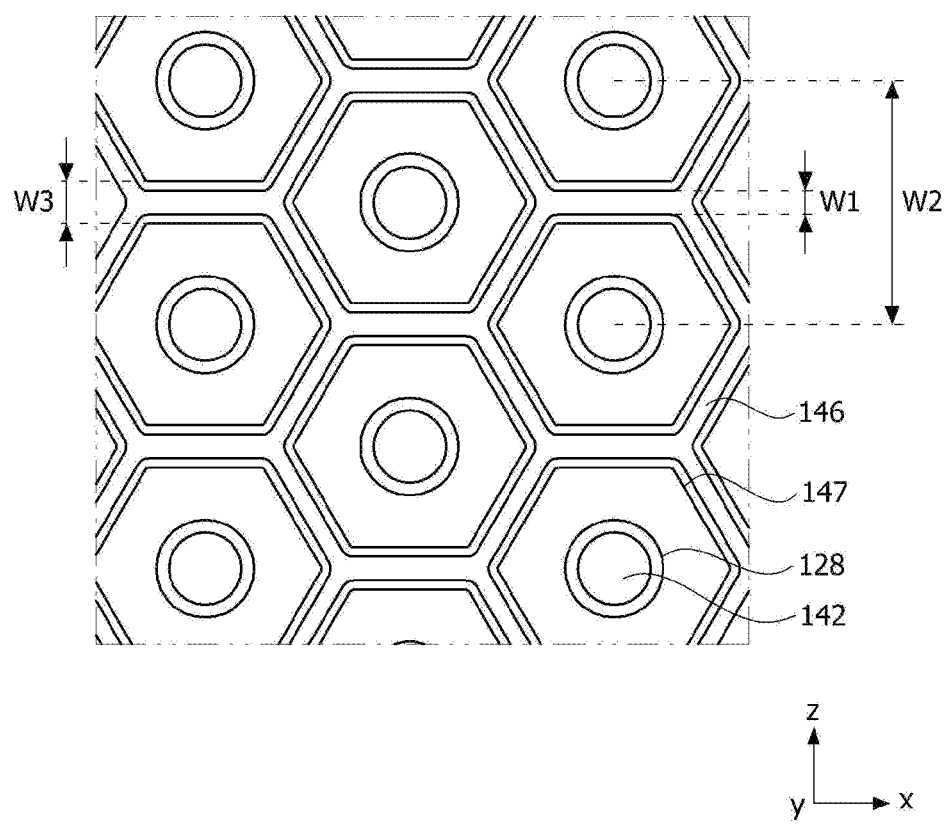

【FIG. 7】
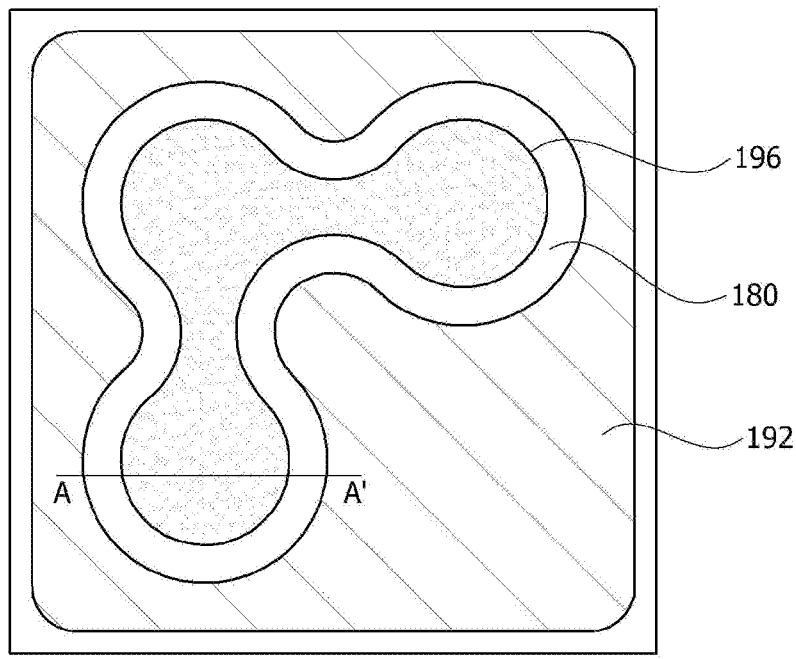
【FIG. 8】
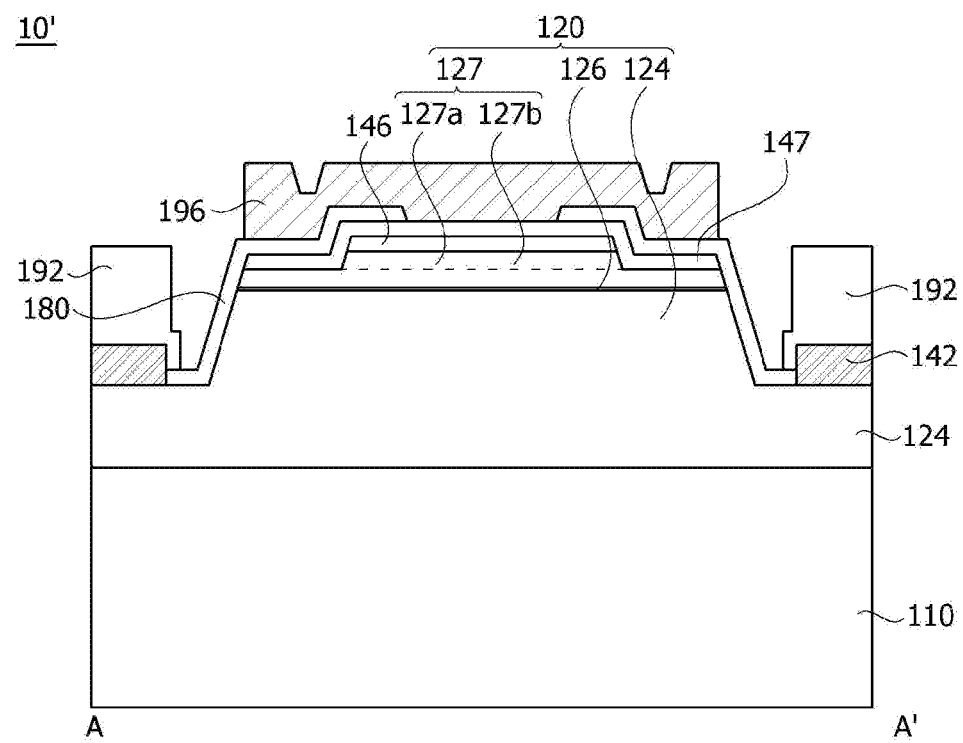

[FIG. 9]
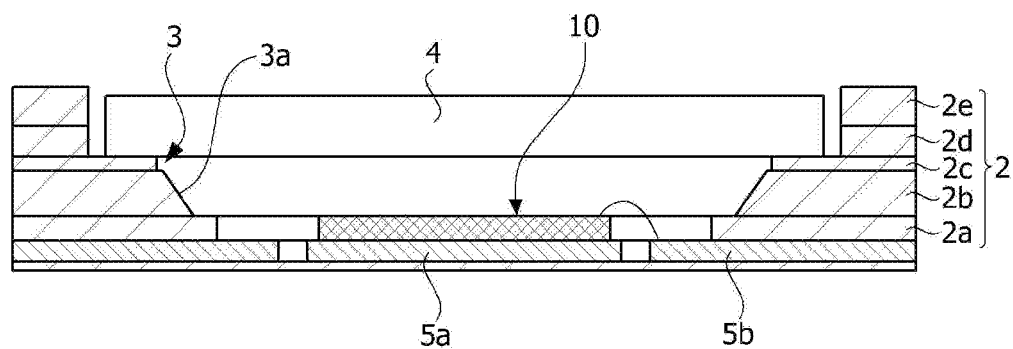
[FIG. 10]
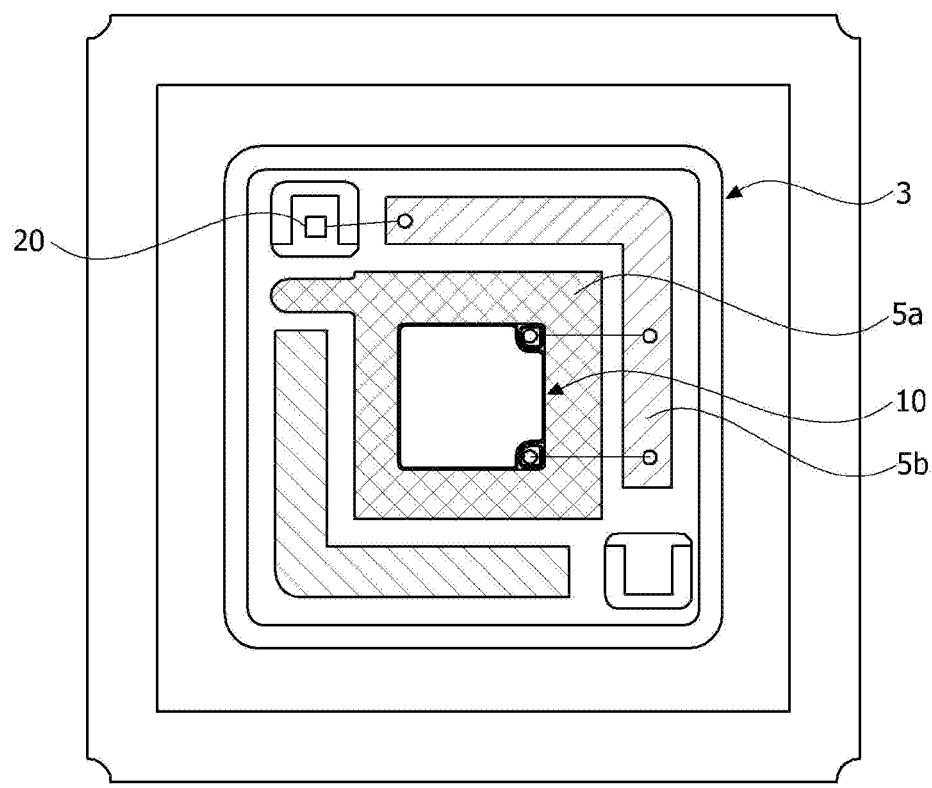

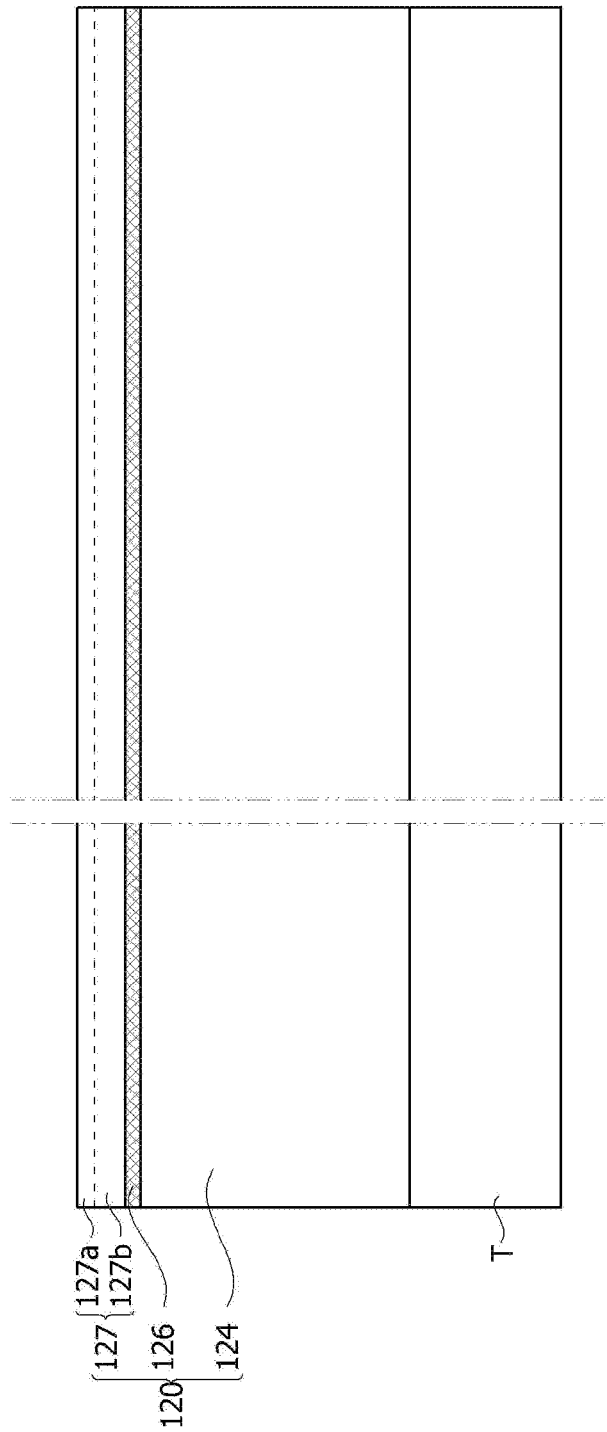
[FIG. 11A]

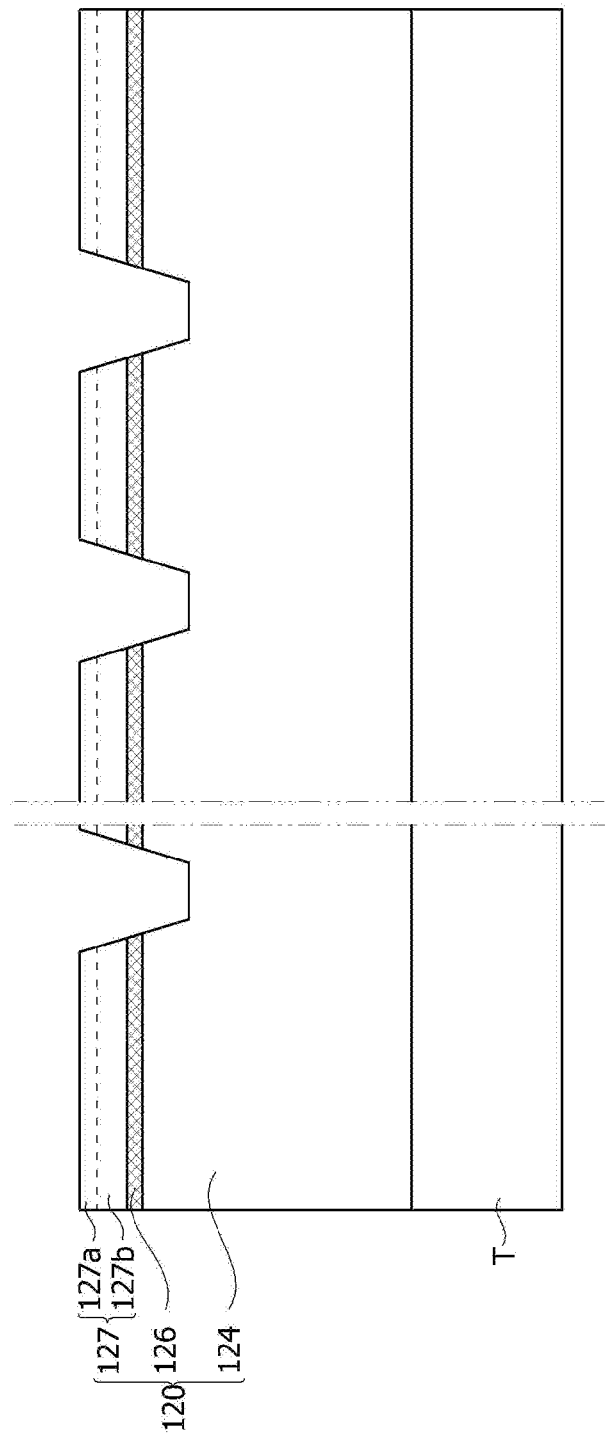
[FIG. 11B]

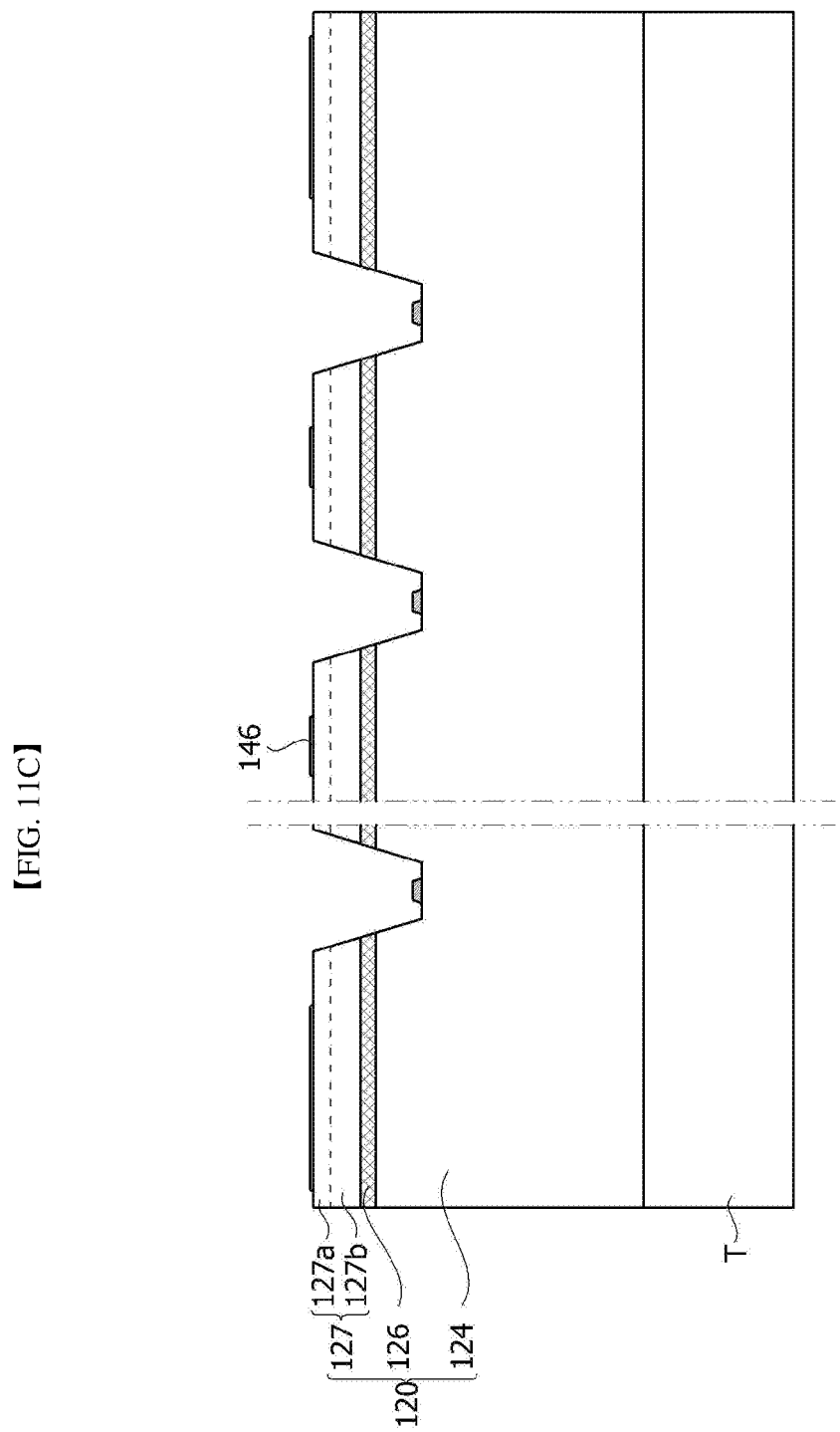
[FIG. 11C]

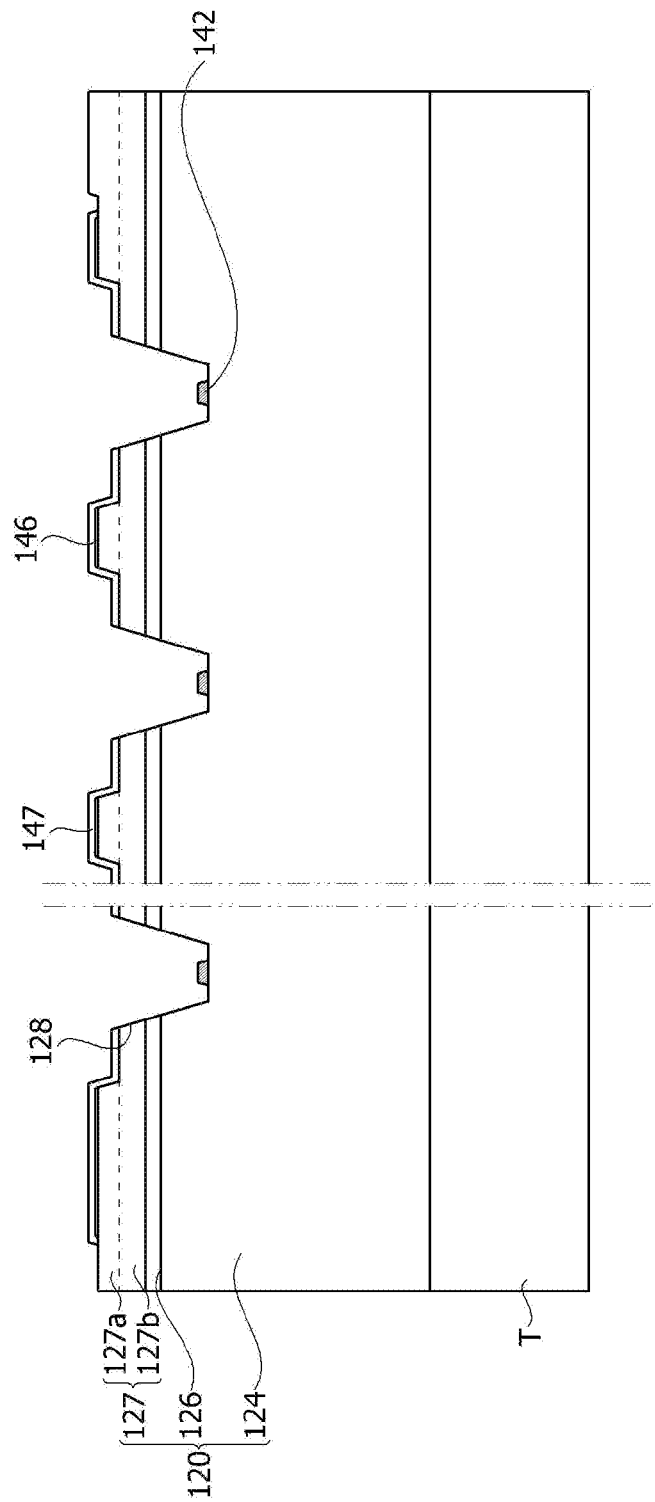
[FIG. 11D]

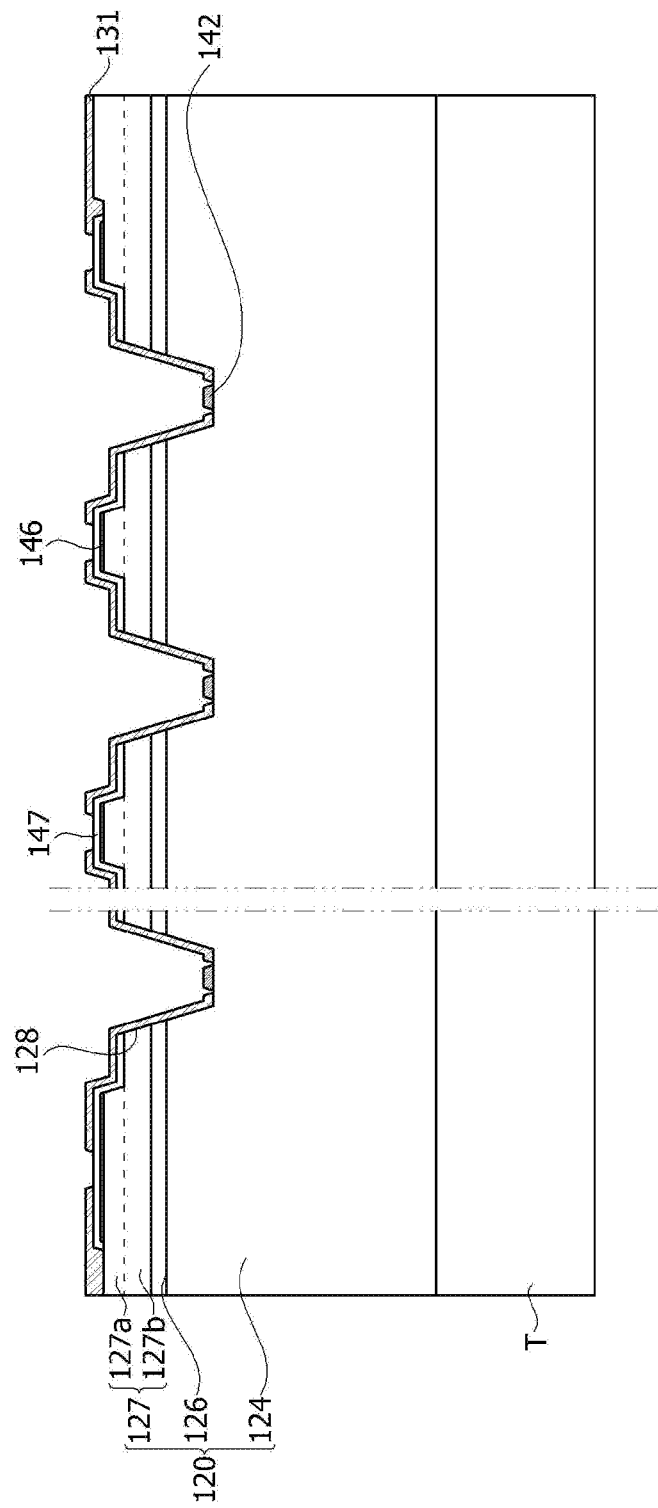
[FIG. 11E]

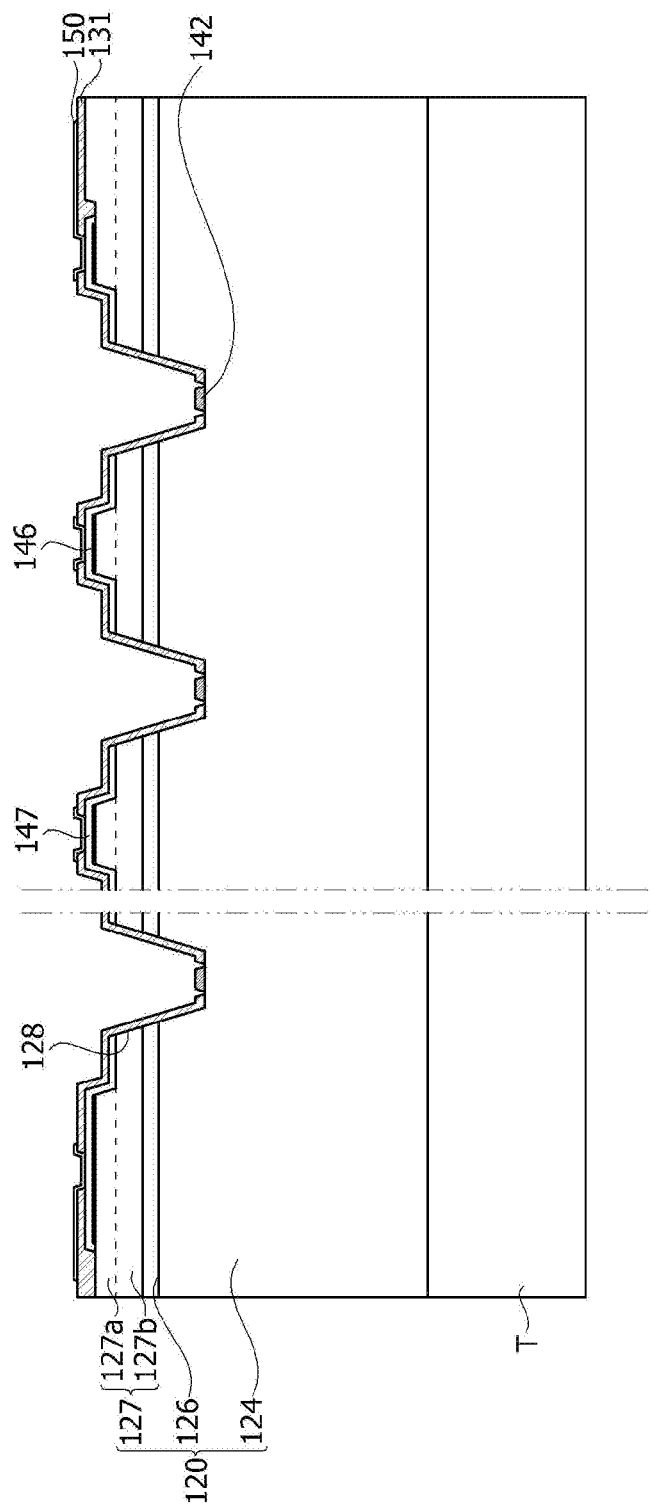
[FIG. 11F]

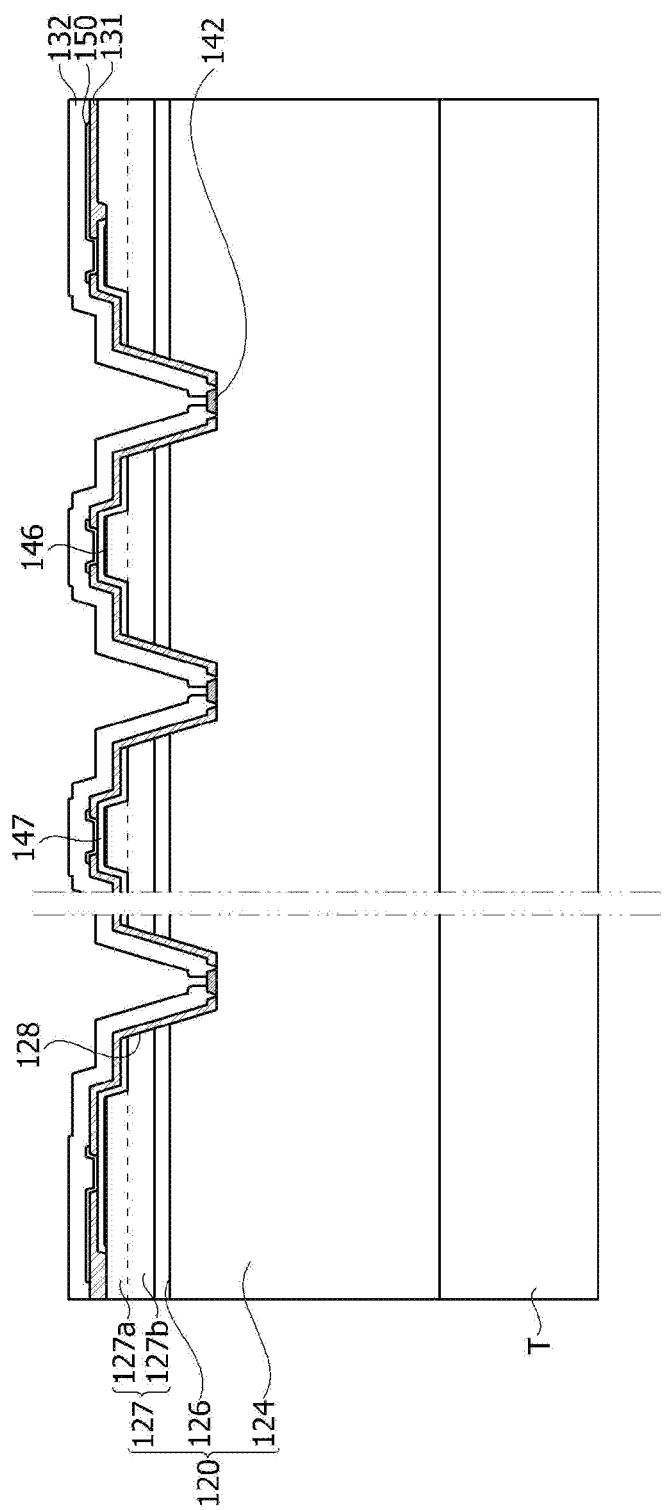
[FIG. 11G]

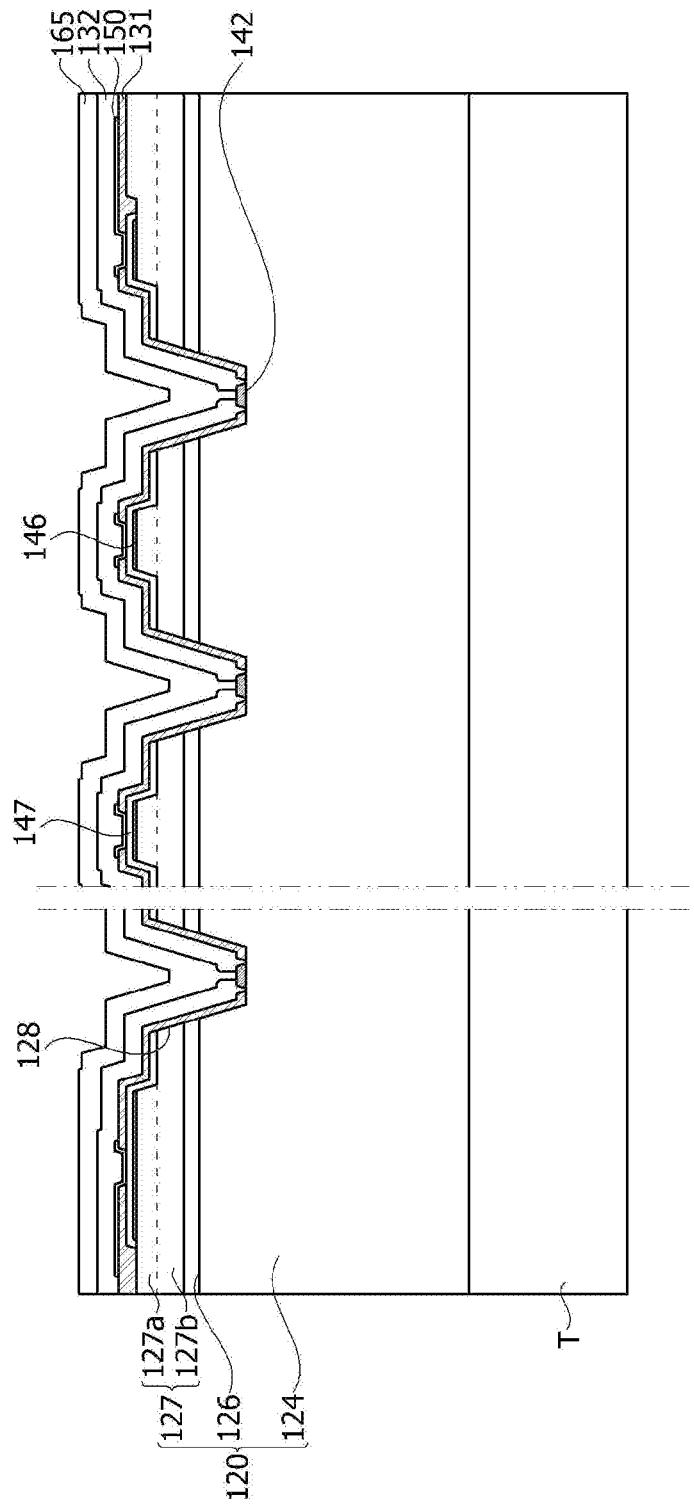
[FIG. 11H]

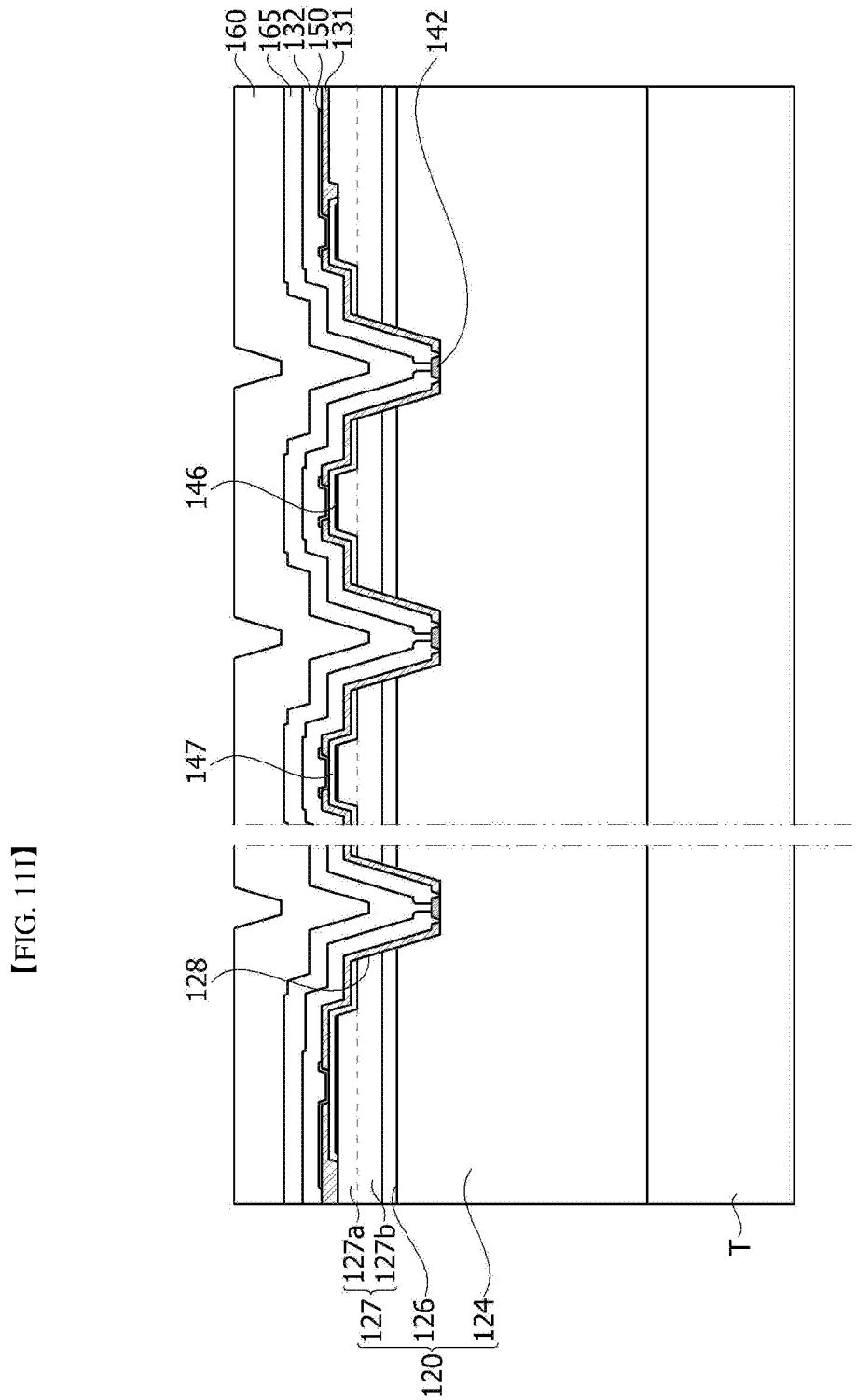
[FIG. 11I]

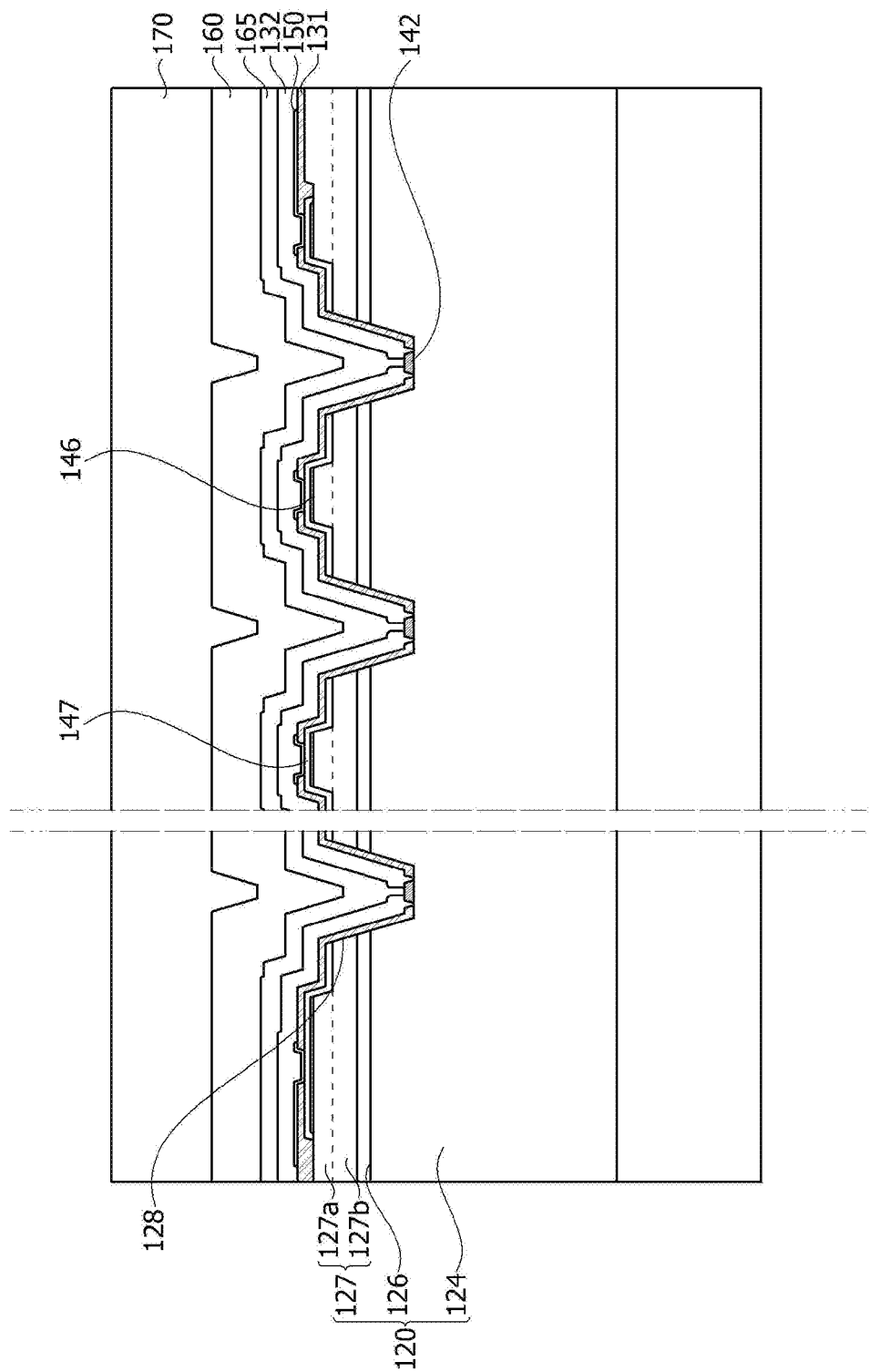
[FIG. 11J]

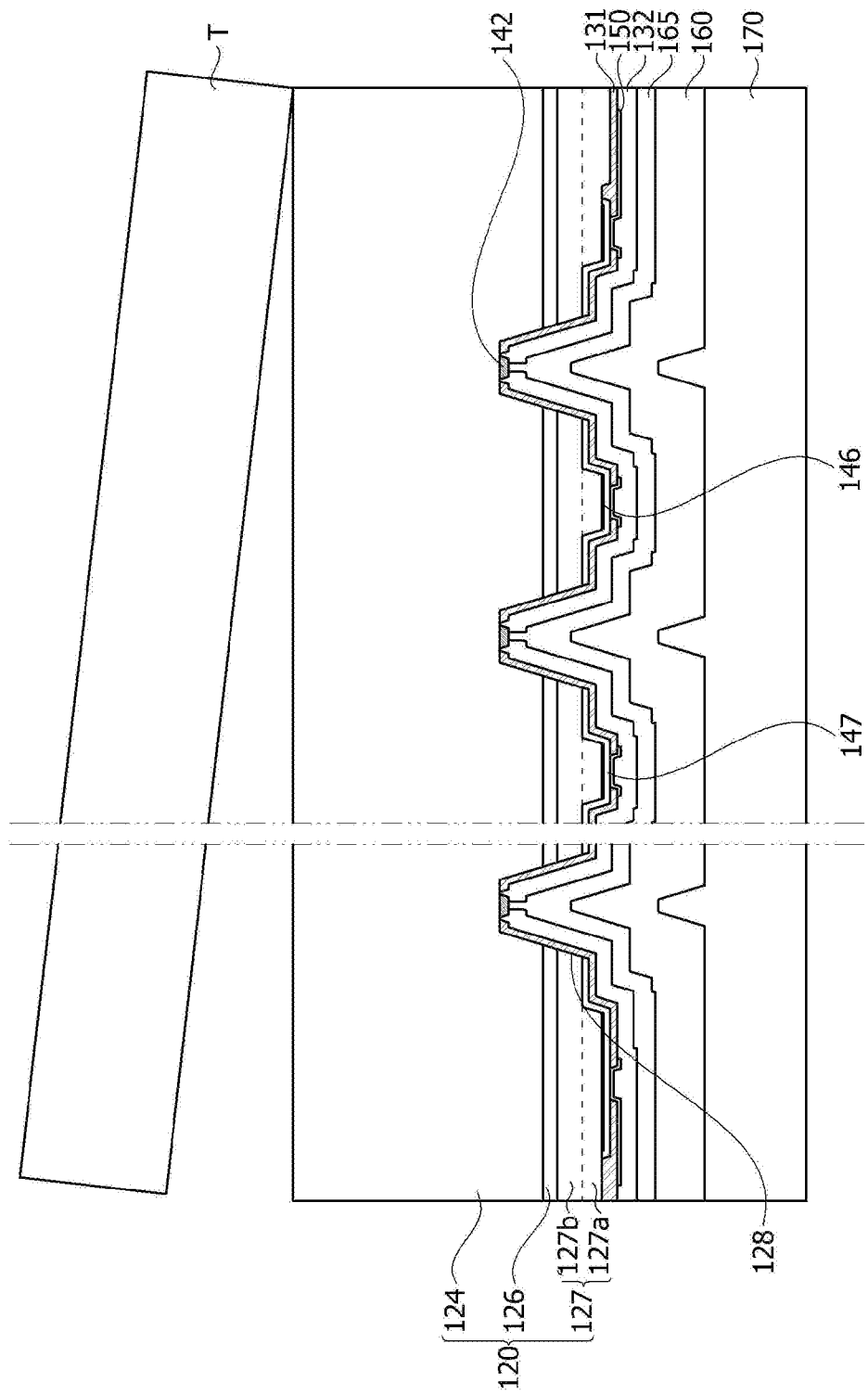
[FIG. 11K]

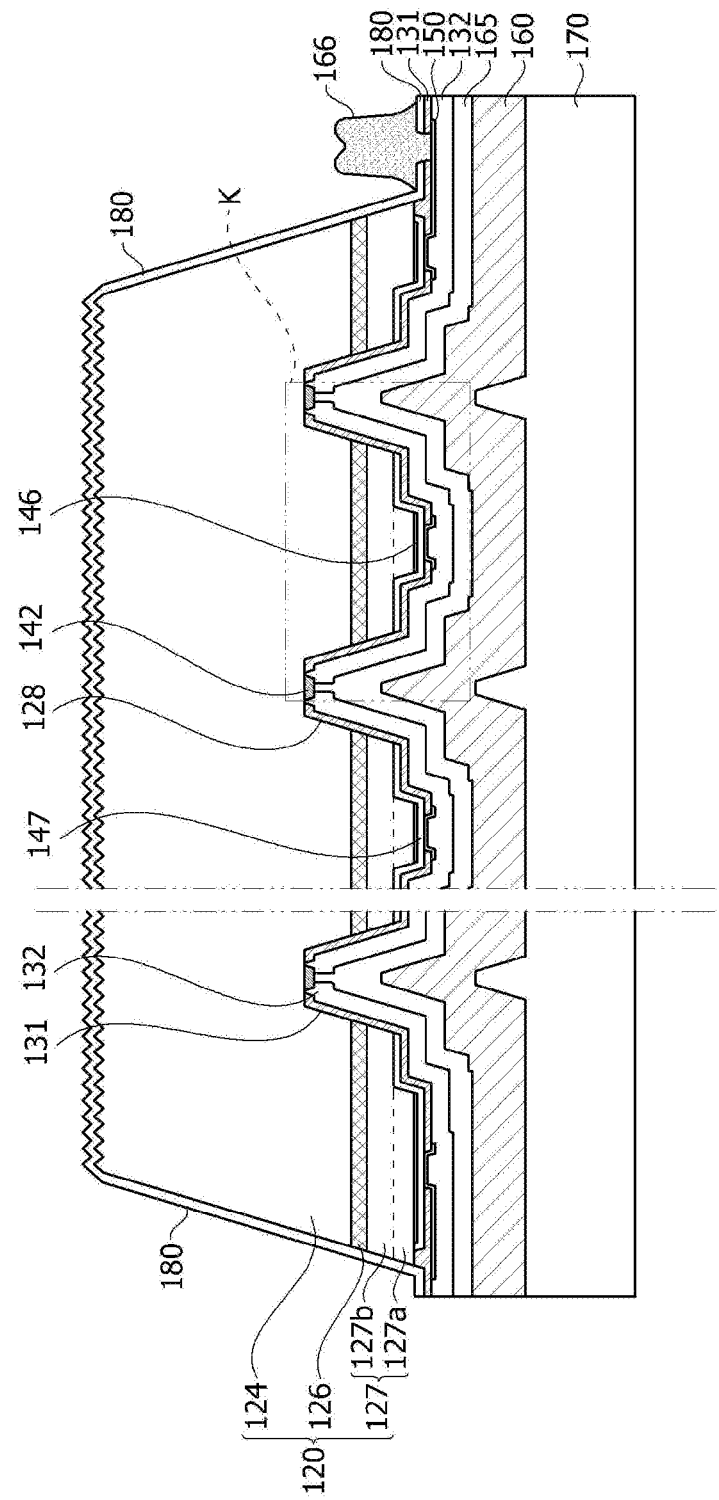
[FIG. 11L]

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2019/003348, filed Mar. 22, 2019, which claims priority to Korean Patent Application No. 10-2018-0039195, filed Apr. 4, 2018, whose entire disclosures are hereby incorporated by reference.

TECHNICAL FIELD

Embodiments relate to a semiconductor device.

BACKGROUND ART

A semiconductor device including a compound, such as GaN and AlGaN, has many advantages, such as wide and adjustable band-gap energy, and thus may be diversely used for light-emitting devices, light-receiving devices, various diodes, and the like.

In particular, a light-emitting device, such as a light-emitting diode or laser diode, using a III-V group or II-VI group compound semiconductor material can realize various colors, such as red, green, blue, or ultraviolet light due to the development of thin-film growth technology and device materials. Also, the light-emitting device can realize efficient white light by using a fluorescent material or combining colors and has the advantages of low power consumption, semi-permanent lifetime, fast response time, safety, and environmental friendliness as compared to existing light sources such as fluorescent lamps and incandescent lamps.

Moreover, due to the development of device materials, when a light-receiving device, such as a photodetector or a solar cell, is fabricated using a III-V group or II-VI group compound semiconductor material, the light-receiving device generates a photocurrent by absorbing light in various wavelength regions, and thus it is possible to use light in various wavelength regions from a gamma-ray region to a radio-wave region. In addition, the light-receiving device has the advantages of fast response time, safety, environmental friendliness, and ease of adjustment of device materials and thus may be easily used for power control or ultra-high frequency circuits or communication modules.

Accordingly, the applications of semiconductor devices are being expanded to transmission modules of optical communication means, light-emitting diode backlights which replace cold cathode fluorescent lamps (CCFLs) constituting the backlights of liquid crystal display (LCD) devices, white light-emitting diode lighting devices which may replace fluorescent lamps or incandescent lamps, vehicle headlights, traffic lights, sensors for sensing gas or fire, and the like. In addition, the applications of semiconductor devices may be expanded to high-frequency application circuits, other power control devices, and communication modules.

In particular, light-emitting devices that emit light in an ultraviolet wavelength range can be used for curing, medical, and sterilization purposes by curing or sterilizing.

Recently, research on ultraviolet light-emitting devices has been actively conducted, but there are problems in that the ultraviolet light-emitting devices are still difficult to realize in a vertical form and are peeled off in the process of separating a substrate and oxidized by moisture such that optical output power is lowered.

SUMMARY

An embodiment is directed to providing a vertical-type semiconductor device.

An embodiment is also directed to providing a semiconductor device with excellent light extraction efficiency.

An embodiment is also directed to providing a semiconductor device with an excellent current spreading effect.

Objectives to be solved by the embodiment are not limited to the above-described objective and will include objectives and effectiveness which may be identified by solutions for the objectives and the embodiments described below.

A semiconductor device according to an embodiment includes a semiconductor structure including a first conductive type semiconductor layer, a second conductive type semiconductor layer, and an active layer disposed between the first conductive type semiconductor layer and the second conductive type semiconductor layer, a first electrode electrically connected to the first conductive type semiconductor layer, a second electrode electrically connected to the second conductive type semiconductor layer, and a reflective layer disposed below the second electrode, wherein the second conductive type semiconductor layer includes a first sub-layer and a second sub-layer that is disposed between the first sub-layer and the active layer and has an aluminum (Al) composition higher than an Al composition of the first sub-layer, the reflective layer is in contact with a bottom surface of the second sub-layer, and the second electrode is in contact with the first sub-layer.

Each of the first sub-layer and the second sub-layer may include aluminum (Al) and gallium (Ga), and in a system containing Al and Ga, the Al composition of the first sub-layer may be in a range of 30% to 50%, and the Al composition of the second sub-layer may be in a range of 50% to 80%.

The Al composition of each of the first sub-layer and the second sub-layer may gradually increase in a direction toward the first conductive type semiconductor layer from the second electrode.

A ratio of the Al composition of the second sub-layer and the Al composition of the first sub-layer may be in a range of 1:0.375 to 1:1.

The semiconductor structure may further include a recess disposed to a partial region of the first conductive type semiconductor layer through the second conductive type semiconductor layer and the active layer, the first electrode may be disposed in the recess, and the reflective layer and the second electrode may be disposed to surround the recess.

The first sub-layer may be disposed on a portion of the bottom surface of the second sub-layer, a side surface of the first sub-layer may be in contact with the bottom surface of the second sub-layer, the second electrode may be disposed below the first sub-layer, and the reflective layer may be disposed to be in contact with a side surface and a bottom surface of the second electrode.

A ratio of an area of the first sub-layer and an area of the second sub-layer may be in a range of 1:1.01 to 1:1.5, a ratio of an area of the first electrode and an area of the second electrode may be in a range of 1:3.88 to 1:5.8, and a ratio of an area of the reflective layer and the area of the second electrode may be in a range of 1:2.4 to 1:3.6.

The semiconductor device may further include a first insulating layer disposed below the semiconductor structure and the reflective layer, a first conductive layer electrically connected to the first electrode, a second conductive layer disposed above the first conductive layer and electrically connected to the reflective layer, a second insulating layer disposed between the first conductive layer and the second conductive layer, a bonding layer disposed below the second conductive layer, and a substrate disposed below the bonding layer.

The reflective layer may extend toward the bottom surface of the second sub-layer from a bottom surface of the first sub-layer.

The reflective layer may be in contact with a side surface of the first sub-layer and may surround the first sub-layer.

Advantageous Effects

According to embodiments, a semiconductor device can be implemented as a vertical type.

Further, a light-emitting device with excellent light extraction efficiency can be manufactured.

Various advantages and effects of the present invention are not limited to the above description and can be more easily understood through the description of specific exemplary embodiments of the present invention.

BRIEF DESCRIPTION OF THE DRAWINGS

FIG. 1 is a cross-sectional view of a semiconductor device according to one embodiment.

FIG. 2 is an enlarged view of portion K in FIG. 1.

FIG. 3 is a conceptual diagram illustrating a process in which light is reflected by a reflective layer.

FIG. 4A is a graph illustrating an aluminum (Al) composition of a second conductive type semiconductor layer.

FIG. 4B is a view illustrating a modified example of FIG. 4A.

FIG. 5 is a plan view of the semiconductor device according to the embodiment.

FIG. 6 is an enlarged view of portion L in FIG. 5.

FIG. 7 is a plan view of a semiconductor device according to another embodiment.

FIG. 8 is a cross-sectional view taken along line AA' in FIG. 7.

FIG. 9 is a conceptual diagram of a package of the semiconductor device according to one embodiment of the present invention.

FIG. 10 is a plan view of the package of the semiconductor device according to one embodiment of the present invention.

FIGS. 11A to 11L are sequence diagrams for describing a method of manufacturing a semiconductor device according to one embodiment.

DETAILED DESCRIPTION

While the present invention is susceptible to various modifications and alternative forms, particular embodiments thereof are shown by way of example in the drawings and will herein be described in detail. It should be understood, however, that there is no intent to limit the present invention to the particular forms disclosed, but on the contrary, the present invention is to cover particular modifications, equivalents, and alternatives falling within the spirit and scope of the present invention.

It will be understood that, although the terms "first," "second," and the like may be used herein to describe various elements, these elements should not be limited by these terms. These terms are only used to distinguish one element from another. For example, a first element could be termed a second element, and a second element could similarly be termed a first element without departing from the scope of the present invention. As used herein, the term "and/or" includes any and all combinations of one or more of the associated listed items.

It will be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

The terms used herein are for the purpose of describing particular exemplary embodiments only and are not intended to be limiting to the present invention. As used herein, singular forms are intended to include plural forms as well, unless the context clearly indicates otherwise. In the present application, it will be further understood that the terms "comprise," "comprising," "include," and/or "including", when used in this specification, specify the presence of stated features, integers, steps, operations, elements, components and/or groups thereof but do not preclude the presence or addition of one or more other features, integers, steps, operations, elements, components and/or groups thereof.

Unless otherwise defined, all terms used herein including technical or scientific terms have the same meanings as those generally understood by one of ordinary skill in the art. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, embodiments of the present invention will be described in detail with reference to the accompanying drawings. Regardless of reference numerals, like numbers refer to like elements throughout the description of the figures, and the description of the same elements will be not reiterated.

A light-emitting structure (identical to a semiconductor structure to be described below) according to an embodiment of the present invention may output light in an ultraviolet wavelength range. As an example, the light-emitting structure may output light in a near-ultraviolet wavelength range (UV-A), light in a far-ultraviolet wavelength range (UV-B), or light in a deep ultraviolet wavelength range (UV-C). The wavelength range may be determined by an aluminum (Al) composition ratio of a light-emitting structure.

As an example, the UV-A may have a peak wavelength in a range of 320 nm to 420 nm, the UV-B may have a peak wavelength in a range of 280 nm to 320 nm, and the UV-C may have a peak wavelength in a range of 100 nm to 280 nm.

FIG. 1 is a conceptual diagram of a semiconductor device according to one embodiment, FIG. 2 is an enlarged view of portion K in FIG. 1, and FIG. 3 is a conceptual diagram illustrating a process in which light is reflected by a reflective layer.

First, referring to FIG. 1, a semiconductor device 10 according to one embodiment may include a semiconductor structure 120 including a first conductive type semiconductor layer 124, an active layer 126, and a second conductive type semiconductor layer 127, a first electrode 142 electrically connected to the first conductive type semiconductor layer 124, a second electrode 146 electrically connected to the second conductive type semiconductor layer 127, and a reflective layer 147 disposed below the second electrode 146.

First, the semiconductor structure 120 may include the first conductive type semiconductor layer 124, the active layer 126, and the second conductive type semiconductor layer 127 and may further include a recess 128 that passes through the second conductive type semiconductor layer 127 and the active layer 126 and exposes to a partial region of the first conductive type semiconductor layer 124.

The first conductive type semiconductor layer 124 may be implemented with a compound semiconductor including a III-V group element, a II-VI group element, or the like and may be doped with a first dopant. The first conductive type semiconductor layer 124 may be made of semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, semiconductor materials selected from among GaN, AlGaN, InGaN, InAlGaN, and the like. In addition, the first dopant may be an n-type dopant such as silicon (Si), germanium (Ge), tin (Sn), selenium (Se), or tellurium (Te). When the first dopant is an n-type dopant, the first conductive type semiconductor layer 124 doped with the first dopant may be an n-type semiconductor layer.

The active layer 126 is disposed between the first conductive type semiconductor layer 124 and the second conductive type semiconductor layer 127. The active layer 126 is a layer at which electrons (or holes) injected through the first conductive type semiconductor layer 124 and holes (or electrons) injected through the second conductive type semiconductor layer 127 meet. The active layer 126 may transition to a low energy level due to the recombination of electrons and holes and emit light having an ultraviolet wavelength.

The active layer 126 may have one structure among a single well structure, a multi-well structure, a single quantum well structure, a multi-quantum well (MQW) structure, a quantum dot structure, and a quantum wire structure, but the structure of the active layer 126 is not limited thereto.

For example, the active layer 126 may include a plurality of well layers and a plurality of barrier layers. Each of the well layers and the barrier layers may have a composition formula of $In_{x2}Al_{y2}Ga_{1-x2-y2}N$ ($0 \leq x2 \leq 1$, $0 \leq y2 \leq 1$, and $0 \leq x2+y2 \leq 1$). An Al composition of the well layer may vary according to a wavelength of emitted light.

The second conductive type semiconductor layer 127 may be formed on the active layer 126 and implemented with a compound semiconductor including a III-V group element, a II-VI group element, or the like, and the second conductive type semiconductor layer 127 may be doped with a second dopant. The second conductive type semiconductor layer 127 may be made of semiconductor materials having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or materials selected from among AlInN, AlGaAs, GaP, GaAs, GaAsP, and AlGaInP. When the second dopant is a p-type dopant such as magnesium (Mg), zinc (Zn), calcium (Ca), strontium (Sr), barium (Ba), or the like, the second conductive type semiconductor layer 127 doped with the second dopant may be a p-type semiconductor layer.

The second conductive type semiconductor layer 127 may include a plurality of layers, for example, a first sub-layer 127a and a second sub-layer 127b. In addition, an Al composition of the first sub-layer 127a may be lower than an Al composition of the second sub-layer 127b. Detailed descriptions of the first sub-layer 127a and the second sub-layer 127b will be given below.

An electron blocking layer (not shown) may be disposed between the active layer 126 and the second conductive type semiconductor layer 127. The electron blocking layer (not shown) may block electrons supplied from the first conductive type semiconductor layer 124 from flowing out to the second conductive type semiconductor layer 127, thereby increasing the probability that electrons and holes are recombined with each other in the active layer 126. An energy band gap of the electron blocking layer (not shown) may be greater than an energy band gap of the active layer 126 and/or the second conductive type semiconductor layer 127.

The electron blocking layer (not shown) may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, semiconductor materials selected from among AlGaN, InGaN, InAlGaN, and the like, but the present invention is not limited thereto. In the electron blocking layer (not shown), a layer having a high Al composition and a layer having a low Al composition may be alternately disposed.

A plurality of recesses 128 may be formed in the semiconductor device 10, and the number of recesses 128 may be adjusted to adjust optical output power of the semiconductor device 10.

The first electrode 142 may be disposed in the recess 128 and may be electrically connected to the first conductive type semiconductor layer 124.

The first electrode 142 may be an ohmic electrode and may include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, silver (Ag), nickel (Ni), chromium (Cr), titanium (Ti), aluminum (Al), rhodium (Rh), palladium (Pd), iridium (Ir), tin (Sn), indium (In), ruthenium (Ru), magnesium (Mg), zinc (Zn), platinum (Pt), gold (Au), and hafnium (Hf), but the present invention is not limited to such materials.

The second electrode 146 may be disposed below the second conductive type semiconductor layer 127 and electrically connected to the second conductive type semiconductor layer 127. Specifically, the second electrode 146 may be disposed below the first sub-layer 127a of the second conductive type semiconductor layer 127 so that the first sub-layer 127a may be disposed between the second sub-layer 127b and the second electrode 146.

The second electrode 146 may be an ohmic electrode and may include at least one among ITO, IZO, IZTO, IAZO, IGZO, IGTO, AZO, ATO, GZO, IZON, AGZO, In—Ga ZnO (IGZO), ZnO, IrOx, RuOx, NiO, RuOx/ITO, Ni/IrOx/Au, Ni/IrOx/Au/ITO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but the present invention is not limited to such materials.

The reflective layer 147 may be disposed below the second electrode 146 and may be electrically connected to the second electrode 146. In addition, the reflective layer 147 may reflect light, which is emitted toward the reflective layer 147 from the active layer 122, to an upper portion of the semiconductor structure 120.

The reflective layer 147 may include a material having conductivity and a reflective function and may include, for example, one of Ag and Rh, but the present invention is not limited to such materials. In addition, the reflective layer 147 may include aluminum, but in this case, step coverage is relatively low such that only a portion of the second electrode 146 may be covered. However, the present invention is not limited to such a material.

Further, the semiconductor device 10 according to the embodiment may further include a first insulating layer 131 disposed below the semiconductor structure 120, a second conductive layer 150 disposed below the reflective layer 147, a second insulating layer 132 disposed below the second conductive layer 150, a first conductive layer 165 electrically connected to the first electrode 142, a bonding layer 160 disposed below the first conductive layer 165, and a substrate 170 disposed below the bonding layer 160.

First, the first insulating layer 131 may be disposed between the semiconductor structure 120 and the substrate 170 or may be disposed inside the recess 128. Specifically, the first insulating layer 131 may electrically insulate the first conductive type semiconductor layer 121 exposed by the recess 128, the second conductive type semiconductor layer 123, and the active layer 122 from each other. In addition, the first insulating layer 131 may electrically insulate the first electrode 142 from the active layer 122 and the second conductive type semiconductor layer 123.

In addition, the first insulating layer 131 may be made of a dielectric or an insulator. For example, the first insulating layer 131 may be made of an oxide and/or a nitride and may optionally include, for example, at least one selected from the group consisting of SiO2, SixOy, Si3N4, SixNy, SiOxNy, Al2O3, TiO2, AlN, and the like, but the present invention is not limited to such materials.

In addition, the first insulating layer 131 may be formed as a single-layer or a multi-layer. The first insulating layer 131 may be formed as the multi-layer, and thus, an interface between adjacent layers may be formed.

When the first insulating layer 131 is formed as the single-layer, a path, through which external moisture or contaminants may permeate, may be exposed due to internal defects. On the other hand, when the first insulating layer 131 is formed as the multi-layer, internal defects may be prevented from being exposed to the outside, thereby reducing external moisture and contaminants permeating into the semiconductor structure 120 through the first insulating layer 131. However, the present invention is not limited thereto, and when the internal defects of the first insulating layer 131 exposed to the outside are small, the first insulating layer 131 may be formed as the single-layer.

Further, the first insulating layer 131 may be a distributed Bragg reflector (DBR) having a multi-layer structure that includes Si oxide or a Ti compound. However, the present invention is not limited to the structure, and the first insulating layer 131 may have various reflective structures. Thus, the first insulating layer 131 may improve light extraction efficiency.

The second conductive layer 150 may be disposed below the reflective layer 147 and the first insulating layer 131 to partially cover the reflective layer 147 and the first insulating layer 131. Accordingly, an electrode pad 166, the second conductive layer 150, the reflective layer 147, and the second electrode 146 may provide one electrical channel.

The second conductive layer 150 may be disposed to surround the reflective layer 147 and may be disposed below the reflective layer 147, the second electrode 146, and the first insulating layer 131. The second conductive layer 150 may include a material having high adhesion with the first insulating layer 131 and may be made, for example, of at least one material selected from the group consisting of materials such as Cr, Ti, Ni, and Au, or an alloy thereof, and may be formed of a single-layer or a plurality of layers. However, the present invention is not limited to such materials and structures.

The second conductive layer 150 may be disposed between the first insulating layer 131 and the second insulating layer 132 and may be protected from permeation of external moisture or contaminants by the first insulating layer 131 and the second insulating layer 132. In addition, the second conductive layer 150 may be disposed inside the semiconductor device 10 and may be surrounded by the second insulating layer 132 so as not to be exposed at an outermost side surface of the semiconductor device 10.

The second insulating layer 132 may electrically insulate the second electrode 146, the reflective layer 147, and the second conductive layer 150 from the first conductive layer 165.

The second insulating layer 132 and the first insulating layer 131 may be made of the same material and may be made of at least one selected from the group consisting of SiO2, SixOy, Si3N4, SixNy, SiOxNy, Al2O3, TiO2, and AlN. However, the present invention is not limited to such materials, and the second insulating layer 132 may be made of a different material from the first insulating layer 131.

Further, according to the embodiment, since the second insulating layer 132 is disposed on the first insulating layer 131 between the first electrode 142 and the second electrode 146, when defects are generated in the second insulating layer 132, the first insulating layer 131 may secondarily prevent permeation of external moisture and/or other contaminants. As an example, when the first insulating layer 131 and the second insulating layer 132 are formed as one layer, cracks, internal defects, and the like may be easily propagated in a vertical direction. Accordingly, external moisture or contaminants may permeate into the semiconductor structure 120 through defects exposed to the outside.

Further, the second insulating layer 132 and the first insulating layer 131 may be formed integrally so that a boundary between the first insulating layer 131 and the second insulating layer 132 may not be present.

However, according to the embodiment, since the second insulating layer 132 is separately disposed on the first insulating layer 131, the defects generated in the first insulating layer 131 are difficult to propagate to the second insulating layer 132. Thus, the first insulating layer 131 and the second insulating layer 132 may block the propagation of defects occurring at the interface.

The first conductive layer 165 may be disposed below the second insulating layer 132 and the first reflective layer 147. The first conductive layer 165 may pass through the second insulating layer 132 to be electrically connected to the first electrode 142 and may also be electrically connected to the substrate 170 therebelow. Accordingly, the first conductive layer 165 may have an electrical channel with the first electrode 142 and the substrate 170. The first conductive layer 165 may be made of at least one material selected from the group consisting of materials such as Cr, Ti, Ni, and Au, or an alloy thereof and may be formed of a single-layer or a plurality of layers. In addition, the first conductive layer 165 may be entirely disposed within the semiconductor device 10.

As described above, the electrode pad 166 may pass through the first insulating layer 131 to be disposed on the second conductive layer 150 and may be electrically connected to the second conductive type semiconductor layer 123 so as to have an electrical channel with the second conductive layer 150, the reflective layer 147, and the second electrode 146.

The electrode pad 166 may have a single-layer or multi-layered structure and may include Ti, Ni, Ag, and Au. As an example, the electrode pad 166 may have a structure of Ti/Ni/Ti/Ni/Ti/Au.

The bonding layer 160 may include a conductive material. As an example, the bonding layer 160 may include a material selected from the group consisting of gold, tin, indium, aluminum, silicon, silver, nickel, and copper, or an alloy thereof.

The substrate 170 may be disposed below the bonding layer 160 and may be made of a conductive material. As an example, the substrate 170 may include a metal or a semiconductor material. The substrate 170 may include a metal having high electrical conductivity and/or thermal conductivity. In this case, the substrate 170 may rapidly discharge heat, which is generated when the semiconductor device 10 operates, to the outside. In addition, when the substrate 170 is made of a conductive material, the first electrode 142 may be supplied with a current from the outside through the substrate 170.

A passivation layer 180 may be disposed to surround an outer surface of the semiconductor device 10. Specifically, the passivation layer 180 may be disposed on top surfaces of the semiconductor structure 120, the first insulating layer 131, and the electrode pad 166 and may be disposed to expose a portion of the electrode pad 166. Accordingly, the electrode pad 166 may be electrically connected to the outside through wire bonding or the like.

The top surface of the semiconductor structure 120 may be formed in an uneven shape. For example, a top surface of the first conductive type semiconductor layer 124 may have an uneven structure, and the uneven structure enables the extraction efficiency of light emitted from the semiconductor structure 120 to be improved. The uneven structure may have different average heights based on an ultraviolet wavelength and may have various heights based on the peak wavelength of light emitted to the semiconductor structure 120. Accordingly, the light extraction efficiency of the semiconductor device 10 may be improved.

Referring to FIGS. 2 and 3, as described above, in the second conductive type semiconductor layer 127, the Al composition of the first sub-layer 127a may be lower than the Al composition of the second sub-layer 127b. In addition, each of the first sub-layer 127a and the second sub-layer 127b may be composed of a system containing Al and gallium (Ga). For example, the first sub-layer 127a and the second sub-layer 127b may each include AlGaN and InAlGaN, but the present invention is not limited thereto.

Specifically, the Al composition of the second sub-layer 127b may be in a range of 50% to 80%. In addition, when the Al composition of the second sub-layer 127b is greater than or equal to 50%, the problem of absorbing light may be reduced, and when the Al composition of the second sub-layer 127b is less than or equal to 80%, the problem of degrading current injection efficiency may be reduced. As an example, when the Al composition of the well layer is 40%, the Al composition of the second sub-layer 127b may be 50%.

The Al composition of the first sub-layer 127a may be lower than the Al composition of the well layer. When the Al composition of the first sub-layer 127a is higher than the Al composition of the well layer, the first sub-layer 127a may not be sufficiently ohmic with the second electrode 146 due to an increase in resistance therebetween, and current injection efficiency may be reduced.

The Al composition of the first sub-layer 127a may be greater than or equal to 30% and less than or equal to 50%. When the Al composition is less than or equal to 50%, it is possible to lower the resistance with the second electrode. When the Al composition is greater than or equal to 30%, the problem of absorbing light in the first sub-layer 127a may be reduced.

In the semiconductor device according to the embodiment, a ratio of the Al composition of the second sub-layer and the Al composition of the first sub-layer may be in a range of 1:0.375 to 1:1. When the Al composition ratio is less than 1:0.375, the light absorbed by the first sub-layer 127a increases and thus the light extraction may be degraded, and when the Al composition ratio is greater than 1:1, the first sub-layer 127a may not be sufficiently ohmic with the second electrode due to an increase in resistance therebetween and thus electrical characteristics may be degraded.

A thickness T2 of the first sub-layer 127a may be in a range of 1 nm to 30 nm. The first sub-layer 127a may absorb ultraviolet light so that optical output power may be improved by controlling the thickness of the first sub-layer 127a to be as thin as possible.

In addition, when the thickness of the first sub-layer 127a is greater than or equal to 1 nm, it is possible to decrease resistance of the first sub-layer 127a and thus improve electrical characteristics of the semiconductor device. Also, when the thickness is less than or equal to 30 nm, it is possible to improve optical output power efficiency by decreasing the amount of light absorbed by the first sub-layer 127a.

In addition, a thickness T3 of the second sub-layer 127b may be greater than 10 nm and less than 50 nm. As an example, the thickness of the second sub-layer 127b may be 25 nm. When the thickness of the second sub-layer 127b is greater than or equal to 10 nm, it is possible to secure current-spreading characteristics of the second sub-layer 127b. In addition, when the thickness is less than or equal to 50 nm, it is possible to secure injection efficiency for second carriers injected into the active layer 126 and lower an absorption rate of light emitted from the active layer 126 in the second sub-layer 127b.

In addition, the thickness T2 of the first sub-layer 127a may be different from the thickness T3 of the second sub-layer 127b. As an embodiment, the thickness T2 of the first sub-layer 127a may be less than the thickness T3 of the second sub-layer 127b. A ratio of the thickness of the first sub-layer 127a and the thickness of the second sub-layer 127b may be in a range of 1:1.5 to 1:20. When the thickness ratio is greater than 1:1.5, the thickness of the second sub-layer 127b increases, and thus it is possible to improve current injection efficiency. In addition, when the thickness ratio is less than 1:20, the thickness of the first sub-layer 127a increases, and thus the problem of degrading crystallinity may be reduced. When the first sub-layer 127a is too thin, it is necessary to rapidly change the Al composition in the range of the thickness, and thus the crystallinity may be degraded.

In addition, the Al composition of the first sub-layer 127a may decrease in a direction away from the active layer 126. The first sub-layer 127a may have a lower Al composition than the well layer in order to achieve low contact resistance with the second electrode 146. Accordingly, the first sub-layer 127a may absorb a portion of the light emitted from the active layer 126 as described above.

In addition, a ratio of the thickness T2 of the first sub-layer 127a and a total thickness T1 of the second conductive type semiconductor layer 127 may be 1:3 to 1:70. When the thickness ratio is greater than 1:3, the first sub-layer 127a may secure electrical characteristics (e.g., an operating voltage) of the semiconductor device. When the thickness ratio is less than 1:70, the first sub-layer 127a may secure optical characteristics (e.g., optical output power) of the semiconductor device.

Further, the Al composition of each of the first sub-layer 127a and the second sub-layer 127b may gradually increase in a direction toward the first conductive type semiconductor layer 124 from the second electrode 146. Here, the vertical direction refers to a second direction (a y-axis direction), a first direction (an x-axis direction) is a direction perpendicular to the second direction (the y-axis direction), and a third direction (a z-axis direction) is a direction perpendicular to both the first direction (the x-axis direction) and the second direction (the y-axis direction). For example, the vertical direction may be the same as a direction in which each layer is stacked in the semiconductor structure 120. In addition, the first sub-layer 127a and the second sub-layer 127b may be reduced in width differently. For example, a decreasing rate of aluminum in the first sub-layer 127a may be less than a decreasing rate of aluminum in the second sub-layer 127b.

Further, the first sub-layer 127a may be disposed on a portion of a bottom surface of the second sub-layer 127b. A side surface 127a-1 of the first sub-layer 127a may be in contact with a bottom surface 128b-2 of the second sub-layer 128b. For example, the first sub-layer 127a may include the side surface 127a-1 and a bottom surface 127a-2, and the second sub-layer 127b may include the side surface 127a-1 and the bottom surface 127a-2.

In this case, the side surface 127a-1 of the first sub-layer 127a may be in contact with the bottom surface 128b-2 of the second sub-layer 127b, and the bottom surface 127a-2 of the first sub-layer 127a may be in contact with a top surface of the second electrode 146. Accordingly, the second conductive type semiconductor layer 127 may have a step portion through which a portion of the bottom surface of the second sub-layer 127b is exposed. A ratio of an area of the first sub-layer 127a and an area of the second sub-layer 127b may be in a range of 1:1.01 to 1:1.5. When the area ratio is less than 1:1.01, a problem exists in that a process is difficult and light is absorbed in the first sub-layer 127a, and when the area ratio is greater than 1:1.5, the area of the second sub-layer 127b becomes great such that reliability is degraded due to the step portion between the second sub-layer 127b and the first sub-layer 127a.

Accordingly, since the area of the first sub-layer 127a and the area of the second sub-layer 127b have the above-described area ratio, electrical characteristics may be improved through low resistance between the first sub-layer 127a and the second electrode 146 while minimizing the amount of light absorbed by the first sub-layer 127a. With such a configuration, in the semiconductor device according to the embodiment, electrical characteristics (e.g., an operating voltage) may be secured and optical output power may be improved.

In addition, the reflective layer 147 may be disposed below the second conductive type semiconductor layer 127 and the second electrode 146. Specifically, the reflective layer 147 may be disposed to be in contact with each of the side surface 127a-1 of the first sub-layer 127a and a bottom surface 127b-2 of the second sub-layer 127b. That is, the reflective layer 147 may be disposed along the side surface 127a-1 of the first sub-layer 127a to have a stepped structure. In addition, the reflective layer 147 may be disposed to extend toward the bottom surface 127b-2 of the second sub-layer 127b from the side surface 127a-1 of the first sub-layer 127a. In other words, the reflective layer 147 may be disposed to overlap the first sub-layer 127a and the second sub-layer 127b in the vertical direction, but, in a partial region, to overlap only the second sub-layer 127b in the vertical direction. Further, the reflective layer 147 may partially overlap the first sub-layer 147a in the first direction (in the x-axis direction) or in the third direction (the z-axis direction), and, at the lower side of the second electrode 146, the reflective layer 147 may not overlap the first sub-layer 147a in the first direction (in the x-axis direction) or in the third direction (the z-axis direction). Thus, since the reflective layer 147 is in contact with the bottom surface 127b-2 of the second sub-layer 127b, light generated in the active layer 126 may be maximally prevented from being absorbed by the first sub-layer 127a. In addition, even when light L1 is emitted toward the substrate 170 through the second sub-layer 127b, the light L1 may be reflected toward an upper portion of the semiconductor device by the reflective layer 147 so that optical characteristics (e.g., light extraction efficiency) may be improved.

Further, since the reflective layer 147 is disposed to be in contact with the side surface 127a-1 of the first sub-layer 127a, the reflective layer 147 may reflect light L2, which is emitted downward through the side surface 127a-1 of the first sub-layer 127a, toward the upper portion of the semiconductor device.

Accordingly, in the semiconductor device according to the embodiment, the reflective layer 147 is disposed to surround the second electrode 146 therebelow and the side surface 127a-1 of the first sub-layer 127a and to be in contact with the bottom surface 127b-2 of the second sub-layer 127b, thereby improving both electrical and optical characteristics.

FIG. 4A is a graph illustrating an Al composition of the second conductive type semiconductor layer, and FIG. 4B is a view illustrating a modified example of FIG. 4A.

In FIGS. 4A and 4B, the Al composition of the second conductive type semiconductor layer may vary in a direction in which a thickness thereof increases. The Al composition of the second conductive type semiconductor layer 127 may decrease toward a bottom surface thereof.

The Al composition of the second conductive type semiconductor layer 127 may be maintained from a top surface (a point where the thickness is zero, that is, a top surface of the second sub-layer 127b) to the bottom surface of the second sub-layer 127b. In addition, the Al composition may be reduced from the top surface of the first sub-layer 127a to the bottom surface of the first sub-layer 127a. For example, as shown in FIG. 4A, the Al composition of the first sub-layer 127a may be linearly reduced, and as shown in FIG. 4B, the Al composition of the first sub-layer 127a may be reduced for each step. For example, the Al composition of the first sub-layer 127a may be varied to have a flat region f and an inclined region d. The flat region f is a region in which the Al composition is maintained, and the inclined region d is a region in which the Al composition increases or decreases.

FIG. 5 is a plan view of the semiconductor device according to the embodiment, and FIG. 6 is an enlarged view of portion L in FIG. 5.

Referring to FIGS. 5 and 6, the semiconductor device may include a plurality of first regions 136 separated according to the first electrode 142 in a plan view. The plurality of first regions 136 may be disposed to be spaced apart from each other and may have various shapes. As an example, the first region 136 may have a polygonal shape, such as a hexagonal, octagonal, or triangular shape, or a circular shape.

In addition, the reflective layer 147 may be disposed in the first region 136 and, specifically, may be disposed to surround the recess 128 and the first electrode 142 in a plan view (an XZ plane). Accordingly, a current may be injected through the first electrode 142, and the first electrode 142 and the reflective layer 147 may be disposed in a region having a current density of 30% to 40% based on 100% of a current density of the first electrode 142 so that light generated in a region around the first electrode 142 may be reflected upward.

For example, the reflective layer 147 may be disposed to surround the first electrode 142 to reflect the light emitted downward through the second sub-layer toward the upper portion of the semiconductor device, thereby improving light extraction efficiency.

In addition, in the semiconductor device, a ratio of an area 51 of the first electrode 142 and an area S2 of the second electrode 146 may be in a range of 1:3.88 to 1:5.8. When the area ratio is less than 1:3.88, an area for ohmic contact is reduced as the area of the second electrode decreases, and thus there is a problem of increasing resistance. In addition, when the area ratio is greater than 1:5.8, light is absorbed by the second sub-layer in ohmic contact with the second electrode, and thus there is a problem of degrading light extraction.

In addition, in the semiconductor device, a ratio of an area S3 of the reflective layer 147 and the area S2 of the second electrode 146 may be in a range of 1:2.4 to 1:3.6. When the area ratio is less than 1:2.4, light is absorbed by the second electrode 146 and the first sub-layer, and thus there is a problem of degrading light extraction efficiency. When the area ratio is greater than 1:3.6, there is a problem in that an area of the ohmic contact through the second electrode 146 is reduced.

In addition, a minimum width W1 of the second electrode 146 may be less than a minimum width W3 of the reflective layer 147. In addition, a ratio of the minimum width W1 of the second electrode 146 and the minimum width W3 of the reflective layer 147 may be in a range of 1:2.5 to 1:3.5. When the width ratio is less than 1:2.5, the reflective layer 147 may not surround the second electrode 146 and the first sub-layer 127a, and thus there is a problem in that light extraction efficiency is degraded due to the light reflection. When the width ratio is greater than 1:3.5, the area of the ohmic contact may be reduced, and thus there is a problem in that electrical characteristics are degraded.

In addition, the minimum width W3 of the reflective layer 147 may be different from a minimum width of the first sub-layer 127a. As an embodiment, the minimum width W3 of the reflective layer 147 may be greater than the minimum width of the first sub-layer 127a. In addition, the minimum width of the first sub-layer 127a may be greater than or equal to the minimum width of the second electrode 146.

Further, a ratio of the minimum width W1 of the second electrode 146 and a distance W2 between the adjacent recesses may be in a range of 1:3 to 1:10. When the length ratio is less than 1:3, the area of the active layer is reduced compared to the increased area of the recess 128, and thus there is a limit in that light extraction efficiency is degraded. When the length ratio is greater than 1:10, current spreading through the first electrode 142 of the recess may be reduced, and thus optical characteristics may be deteriorated.

FIG. 7 is a plan view of a semiconductor device according to another embodiment, and FIG. 8 is a cross-sectional view taken along line AA' in FIG. 7.

Referring to FIGS. 7 and 8, a semiconductor device 10' according to another embodiment may include a semiconductor structure 120 including a first conductive type semiconductor layer 124, an active layer 126, and a second conductive type semiconductor layer 127, a first electrode 142 electrically connected to the first conductive type semiconductor layer 124, and a second electrode 146 electrically connected to the second conductive type semiconductor layer 127.

As described above, the semiconductor structure 120 may include the first conductive type semiconductor layer 124, the active layer 126, and the second conductive type semiconductor layer 127 and may include a recess 128 that passes through the second conductive type semiconductor layer 127 and the active layer 126 and exposes a partial region of the first conductive type semiconductor layer 124. In addition, the contents of the first electrode 142, the second electrode 146, and the passivation layer 180 may also be equally applied.

Further, as described above, the second conductive type semiconductor layer 127 may include a first sub-layer 127a and a second sub-layer 127b, and the second sub-layer 127b may be disposed between the first sub-layer 127a and the active layer 126.

In addition, the second electrode 146 may be disposed on the first sub-layer 127a, and a reflective layer 147 may be disposed to surround a side surface of the first sub-layer 127a so that light extracted through the second sub-layer 127b may be reflected toward the side surface of the first sub-layer 127a or a lower portion of the semiconductor device.

As in the aforementioned description, an Al composition of the first sub-layer 127a may be less than an Al composition of the second sub-layer 127b. In addition, the Al composition of the second sub-layer 127b may be in a range of 50% to 80%. In addition, when the Al composition of the second sub-layer 127b is greater than or equal to 50%, the problem of absorbing light may be reduced, and when the Al composition of the second sub-layer 127b is less than or equal to 80%, the problem of degrading current injection efficiency may be reduced. As an example, when an Al composition of a well layer is 40%, the Al composition of the second sub-layer 127b may be 50%.

The Al composition of the first sub-layer 127a may be lower than the Al composition of the well layer. When the Al composition of the first sub-layer 127a is higher than the Al composition of the well layer, the first sub-layer 127a may not be sufficiently ohmic with the second electrode 146 due to an increase in resistance therebetween, and current injection efficiency may be reduced.

In addition, each of the first sub-layer 127a and the second sub-layer 127b may be composed of a system containing Al and Ga. For example, the first sub-layer 127a and the second sub-layer 127b may each include AlGaN and InAlGaN, but the present invention is not limited thereto. The Al composition of the first sub-layer 127a may be greater than or equal to 30% and less than or equal to 50%. When the Al composition is less than or equal to 50%, it is possible to lower the resistance with the second electrode. When the Al composition is greater than or equal to 30%, the problem of absorbing light in the first sub-layer 127a may be reduced.

In addition, a thickness of the first sub-layer 127a may be less than a thickness of the second sub-layer 127b. A ratio of the thickness of the first sub-layer 127a and the thickness of the second sub-layer 127b may be in a range of 1:1.5 to 1:20. When the thickness ratio is greater than 1:1.5, the thickness of the second sub-layer 127b increases, and thus it is possible to improve current injection efficiency. Also, when the thickness ratio is less than 1:20, the thickness of the first sub-layer 127a increases, and thus the problem of degrading crystallinity may be reduced. When the first sub-layer 127a is too thin, it is necessary to rapidly change the Al composition in the range of the thickness, and thus the crystallinity may be degraded.

FIG. 9 is a conceptual diagram of a package of the semiconductor device according to one embodiment of the present invention, and FIG. 10 is a plan view of the package of the semiconductor device according to one embodiment of the present invention.

Referring to FIG. 9, a package of the semiconductor device 10 may include a body 2 including a groove 3 (opening), the semiconductor device 10 disposed in the body 2, and a pair of lead frames 5a and 5b disposed in the body 2 and electrically connected to the semiconductor device 10. The semiconductor device 10 may include all of the above-described components.

The body 2 may include a material or a coating layer that reflects ultraviolet light. The body 2 may be formed by stacking a plurality of layers 2a, 2b, 2c, 2d, and 2e. The plurality of layers 2a, 2b, 2c, 2d, and 2e may include the same material or different materials. As an example, the plurality of layers 2a, 2b, 2c, 2d, and 2e may include an aluminum material.

The groove 3 may be formed to be wider as a distance from the semiconductor device 10 is increased, and a step portion 3a may be present on an inclined surface thereof.

A light-transmitting layer 4 may cover the groove 3. The light-transmitting layer 4 may be made of a glass material, but the present invention is not necessarily limited thereto. A material for the light-transmitting layer 4 is not specifically limited as long as the material is capable of effectively transmitting ultraviolet light. The inside of the groove 3 may be an empty space.

Referring to FIG. 10, the semiconductor device 10 may be disposed on a first lead frame 5a and may be connected to a second lead frame 5b using a wire 20. In this case, the second lead frame 5b may be disposed to surround a side surface of the first lead frame.

FIGS. 11A to 11E are sequence diagrams for describing a method of manufacturing a semiconductor device according to one embodiment.

The method of manufacturing a semiconductor device according to the embodiment may include growing a semiconductor structure 120, forming a recess 128, disposing a first electrode 142 and a second electrode 146, disposing a first insulating layer 131, a second reflective layer 145, and a second conductive layer 150, disposing a second insulating layer 132, disposing a second conductive layer 150, disposing a bonding layer 160, disposing a first conductive layer 165, and disposing passivation and an electrode pad 166.

First, referring to FIG. 11A, the semiconductor structure 120 may be grown. The semiconductor structure 120 may be grown on a first temporary substrate T. For example, a first conductive type semiconductor layer 121, an active layer 122, and a second conductive type semiconductor layer 123 may be grown on the first temporary substrate T.

The first temporary substrate T may be a growth substrate 170. For example, the first temporary substrate T may be made of at least one selected from among sapphire (Al2O3), SiC, GaAs, GaN, ZnO, Si, GaP, InP, and Ge, but the present invention is not limited to such a material.

Further, the semiconductor structure 120 may be formed using, for example, a metal-organic chemical vapor deposition (MOCVD) method, a chemical vapor deposition (CVD) method, a plasma-enhanced chemical vapor deposition (PECVD) method, a molecular beam epitaxy (MBE) method, a hydride vapor phase epitaxy (HVPE) method, or the like, but the present invention is not limited thereto.

Descriptions of the first conductive type semiconductor layer 121, the active layer 122, and the second conductive type semiconductor layer 123 may be the same as described above. That is, the second conductive type semiconductor layer 127 may include a first sub-layer 127a and a second sub-layer 127b.

Referring to FIG. 11B, the semiconductor device may include the recess 128. The recess 128 may be positioned to pass through the second conductive type semiconductor layer 123 and the active layer 122 such that a partial region of the first conductive type semiconductor layer 121 is exposed. For example, the recess 128 may include an outer side surface of the second conductive type semiconductor layer 123, an outer side surface of the active layer 122, and an exposed bottom surface of the first conductive type semiconductor layer 121.

Specifically, when a process margin for removing only the second conductive type semiconductor layer 123 and the active layer 122 is possible, the recess 128 may be composed of the outer side surface of the second conductive type semiconductor layer 123, the outer side surface of the active layer 122, and the bottom surface of the first conductive type semiconductor layer 121. That is, the bottom surface of the first conductive type semiconductor layer 121 may be a surface that is in contact with a top surface of the active layer 122.

However, when a process margin for disposing the recess 128 is taken into account, the recess 128 may further include not only the exposed bottom surface of the first conductive type semiconductor layer 121 but also an inclined surface of the first conductive type semiconductor layer 121.

Referring to FIG. 11C, the first electrode 142 and the second electrode 146 may be disposed on the semiconductor structure 120.

The first electrode 142 may be disposed in the recess 128 to be in contact with the exposed first conductive type semiconductor layer 124. In addition, the second electrode 146 may be disposed on the first sub-layer 127a of the second conductive type semiconductor layer 127. Here, the first electrode 142 and the second electrode 146 may be disposed regardless of the order.

Referring to FIG. 11D, partial regions of the second electrode 146 and the first sub-layer 127a may be etched. Accordingly, a structure in which the first sub-layer 127a and the second electrode 146 are stacked on the second sub-layer 127b may be formed. In addition, a reflective layer 147 may be disposed on the second electrode 146 and the second sub-layer 127b. That is, the reflective layer 147 may be disposed on a top surface of the second sub-layer 147b, a side surface of the first sub-layer 147a, and on a top surface of the second electrode 146 so as to surround the first sub-layer 147a and the second electrode 146. As a result, the reflective layer 147 reflects light received through the second sub-layer 147b to improve optical characteristics and also causes the area of the first sub-layer 147a to be reduced to improve electrical properties due to a decrease in ohmic resistance.

Referring to FIG. 11E, a first insulating layer 131 may be disposed on the reflective layer 147 and the semiconductor structure 120. In addition, the first insulating layer 131 may be partially removed by etching, and due to the etching, the reflective layer 147 may have a partially exposed surface.

Referring to FIG. 11F, the second conductive layer 150 may be disposed on the exposed surface of the reflective layer 147 such that the reflective layer 147 may be electrically connected to the second conductive layer 150. In addition, since the second conductive layer 150 is disposed on the first insulating layer 131, the second conductive layer 150 may be electrically insulated from the first conductive type semiconductor layer 121 by the first insulating layer 131. In addition, the second conductive layer 150 may be electrically connected to the second electrode 146 to form an electrical channel therebetween and may be etched so as not to be exposed to an outer side surface of the semiconductor device.

Referring to FIG. 11G, the second insulating layer 132 may be disposed on the semiconductor structure 120. The second insulating layer 132 may be positioned on the second conductive layer 150, the first insulating layer 131, the second electrode 146, and the first electrode 142 and may be disposed to surround the second conductive layer 150, the first insulating layer 131, the second electrode 146, and the first electrode 142. In addition, the second insulating layer 132 may be disposed on the first insulating layer 131. Thus, even when cracks are generated in the first insulating layer 131, the second insulating layer 132 may secondarily protect the semiconductor structure 120. The second insulating layer 132 may be disposed to expose a portion of a top surface of the first electrode 142. For example, the second insulating layer 132 may pass through a portion of the top surface of the first electrode 142. The second insulating layer 132 may electrically insulate the second electrode 146 from the first conductive layer 165.

Referring to FIG. 11H, the first conductive layer 165 may be disposed on the exposed top surface of the first electrode 142. As a result, the first conductive layer 165 may be electrically connected to the first reflective layer 147 so that the first conductive layer 165, the first electrode 142, and the first reflective layer 147 may have an electrical channel. In addition, a first bonding layer 160a may be disposed on the first conductive layer 165.

Referring to FIGS. 11I and 11J, the first bonding layer (not shown) may be disposed on the first conductive layer 165, and a second bonding layer (not shown) may be disposed below the substrate 170. In addition, the first bonding layer (not shown) and the second bonding layer (not shown) may be combined with each other to provide the bonding layer described above. Here, the first bonding layer and the second bonding layer may be combined under a predetermined temperature and pressure.

Further, the bonding layer 160 may include a conductive material. As an example, the bonding layer 160 may include a material selected from the group consisting of gold, tin, indium, aluminum, silicon, silver, nickel, and copper, or an alloy thereof.

Further, the substrate 170 may be disposed on the second bonding layer (not shown). The bonding layer 160 may be formed by combining the first bonding layer and the second bonding layer in the state in which the substrate 170 is disposed on the second bonding layer. However, the present invention is not limited thereto.

In addition, as described with reference to FIG. 1, the substrate 170 may be made of a conductive material. As an example, the substrate 170 may include a metal or a semiconductor material. The substrate 170 may include a metal having high electrical conductivity and/or thermal conductivity. In this case, heat generated when the semiconductor device 10 operates may be rapidly discharged to the outside. In addition, when the substrate 170 is made of a conductive material, the first electrode 142 may be supplied with a current from the outside through the substrate 170.

The substrate 170 may include a material selected from the group consisting of silicon, molybdenum, tungsten, copper, and aluminum or an alloy thereof.

In addition, referring to FIG. 11K, the first temporary substrate T may be separated from the semiconductor structure 120. For example, the first temporary substrate T may be separated from the semiconductor structure 120 by emitting laser light onto the first temporary substrate T. However, the present invention is not limited to such a manner.

Referring to FIG. 11L, patterns may be present by etching the first conductive type semiconductor layer 121 in some regions of the semiconductor structure 120. In addition, the first insulating layer 131 may be etched such that the second conductive layer 150 is exposed in the etched region. In addition, the electrode pad 166 may be disposed in a hole.

Further, the passivation layer 180 may be disposed on top and side surfaces of the semiconductor structure 120. As described above, the passivation layer 180 may have a thickness of 200 nm to 500 nm. When the thickness is greater than or equal to 200 nm, a device may be protected from external moisture or foreign substances, thereby improving electrical and optical reliability of the device. When the thickness is less than or equal to 500 nm, it is possible to reduce stress applied to the semiconductor device 10, to prevent a decrease in optical and electrical reliability of the semiconductor device 10, and to reduce costs of the semiconductor device 10, which are increased by an increase in a processing time of the semiconductor device 10. However, the present invention is not limited to such a configuration.

Further, before the passivation layer 180 is disposed, uneven portions may be formed on the top surface of the semiconductor structure 120. The uneven portions enable extraction efficiency of light emitted from the semiconductor structure 120 to be improved. Heights of the uneven portions may be differently adjusted according to a wavelength of light generated in the semiconductor structure 120.

In addition, as described above with reference to FIG. 9, the semiconductor structure may be disposed on the lead frame of the package of the semiconductor device, or a circuit pattern of a circuit board. The semiconductor device may be applied to various types of light source devices. As an example, the light source devices may be concepts including a sterilizing device, a curing device, a lighting device, a display device, a vehicle lamp, and the like. That is, the semiconductor device may be disposed in a case and applied to various electronic devices configured to provide light.

The sterilizing device may include the semiconductor device according to the embodiment to sterilize a desired region. The sterilizing device may be applied to household appliances such as a water purifier, an air conditioner, and a refrigerator, but the present invention is not necessarily limited thereto. That is, the sterilizing device may be applied to all of various products (e.g., medical instruments) that need to be sterilized.

As an example, the water purifier may include a sterilizing device according to the embodiment to sterilize circulating water. The sterilizing device may be disposed at a nozzle or a discharge port through which water circulates so as to irradiate water with ultraviolet light. Here, the sterilizing device may include a waterproof structure.

The curing device may include the semiconductor device according to the embodiment to cure various types of liquid. A liquid may be the broadest concept including various materials which are cured when irradiated with ultraviolet light. As an example, the curing device may cure various types of resins. Alternatively, the curing device may be applied to cure a cosmetic product such as a manicure.

The lighting device may include a light source module including the substrate and the semiconductor device according to the embodiment, a heat dissipation part configured to radiate heat of the light source module, and a power supply configured to process or convert an electrical signal received from the outside and supply the signal to the light source module. In addition, the lighting device may include a lamp, a head lamp, a street light, or the like.

The display device may include a bottom cover, a reflective plate, a light-emitting module, a light guide plate, an optical sheet, a display panel, an image signal output circuit, and a color filter. The bottom cover, the reflective plate, the light-emitting module, the light guide plate, and the optical sheet may constitute a backlight unit.

The reflective plate may be placed on the bottom cover, and the light-emitting module may emit light. The light guide plate may be placed in front of the reflective plate to guide light emitted by the light-emitting module forward, and the optical sheet may include a prism sheet or the like and may be placed in front of the light guide plate. The display panel may be placed in front of the optical sheet, the image signal output circuit may supply an image signal to the display panel, and the color filter may be placed in front of the display panel.

When the semiconductor device is used as a backlight unit of a display device, the semiconductor device may be used as an edge-type backlight unit or a direct-type backlight unit.

The semiconductor device may be a laser diode in addition to the above-described light-emitting diode.

Like the light-emitting device, the laser diode may include a first conductive type semiconductor layer, an active layer, and a second conductive type semiconductor layer that have the above-described structures. In addition, the laser diode may utilize an electroluminescence phenomenon in which light is emitted when current flows after bonding a p-type first conductive type semiconductor and an n-type second conductive type semiconductor but has a difference in the directionality and phase of the emitted light. That is, the laser diode uses stimulated emission and constructive interference phenomena so that light having a specific single wavelength (monochromatic beam) may be emitted at the same phase and in the same direction. Due to these characteristics, the laser diode may be used for optical communication or medical equipment, semiconductor processing equipment, or the like.

A light-receiving device may include, for example, a photodetector, which is a kind of transducer configured to detect light and convert the intensity of the light into an electric signal. Such a photodetector includes a photocell (silicon or selenium), a photoconductor element (cadmium sulfide or cadmium selenide), a photodiode (PD) (for example, a PD having a peak wavelength in a visible blind spectral region or a true blind spectral region), a phototransistor, a photomultiplier tube, a phototube (vacuum or gas-filled), an infra-red (IR) detector, and the like, but the embodiment is not limited thereto.

In addition, the semiconductor device such as the photodetector may generally be manufactured using a direct bandgap semiconductor having a high photoconversion efficiency. Alternatively, the photodetector has various structures and the most common structure may include a pin-type photodetector using a p-n junction, a Schottky-type photodetector using a Schottky junction, a metal-semiconductor-metal (MSM)-type photodetector, or the like.

Like the light-emitting device, the photodiode may include a first conductive type semiconductor layer, an active layer, and a second conductive type semiconductor layer that have the above-described structures and may be formed as a p-n junction or a pin structure. The photodiode operates when a reverse bias or a zero bias is applied, and when light is incident on the photodiode, electrons and holes are generated such that current flows. In this case, the magnitude of current may be approximately proportional to the intensity of light incident on the photodiode.

A photocell or solar cell, which is a kind of photodiode, may convert light into current. Like the light-emitting device, the solar cell may include a first conductive type semiconductor layer, an active layer, and a second conductive type semiconductor layer that have the above-described structures.

Further, the solar cell may be used as a rectifier of an electronic circuit through the rectification characteristics of a general diode using a p-n junction and may be applied to an ultra-high frequency circuit and then may be applied to an oscillation circuit or the like.

Further, the above-described semiconductor device is not necessarily implemented only with semiconductors, and may further include a metal material in some cases. For example, the semiconductor device such as a light-receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

While the embodiments have been mainly described, they are only examples and do not limit the present invention, and it may be known to those skilled in the art that various modifications and applications, which have not been described above, may be made without departing from the essential properties of the embodiments. For example, the specific components described in the embodiments may be implemented while being modified. In addition, it will be interpreted that differences related to the modifications and applications fall within the scope of the present invention defined by the appended claims.

The invention claimed is:

1. A semiconductor device comprising:
a semiconductor structure including a first conductive type semiconductor layer, a second conductive type semiconductor layer, and an active layer disposed between the first conductive type semiconductor layer and the second conductive type semiconductor layer;
a first electrode electrically connected to the first conductive type semiconductor layer;
a second electrode electrically connected to the second conductive type semiconductor layer; and
a reflective layer disposed below the second electrode,
wherein the second conductive type semiconductor layer includes a first sub-layer and a second sub-layer that is disposed between the first sub-layer and the active layer and has an aluminum (Al) composition higher than an Al composition of the first sub-layer,
the reflective layer is in contact with a bottom surface of the second sub-layer, and
the second electrode is in contact with the first sub-layer, wherein
a ratio of an area of the first sub-layer and an area of the second sub-layer is in a range of 1:1.01 to 1:1.5, a ratio of an area of the first electrode and an area of the second electrode is in a range of 1:3.88 to 1:5.8, and a ratio of an area of the reflective layer and the area of the second electrode is in a range of 1:2.4 to 1:3.6.

2. The semiconductor device of claim 1, wherein
the Al composition of the first sub-layer is linearly reduced or stepwise reduced in a direction away from the active layer.

3. The semiconductor device of claim 2, wherein
each of the first sub-layer and the second sub-layer includes aluminum (Al) and gallium (Ga), and in a system containing Al and Ga, the Al composition of the first sub-layer is in a range of 30% to 50%, and the Al composition of the second sub-layer is in a range of 50% to 80%.

4. The semiconductor device of claim 3, wherein the Al composition of each of the first sub-layer and the second sub-layer increases in a direction toward the first conductive type semiconductor layer from the second electrode.

5. The semiconductor device of claim 2, wherein a ratio of the Al composition of the second sub-layer and the Al composition of the first sub-layer is in a range of 1:0.375 to 1:1.

6. The semiconductor device of claim 2, wherein
the semiconductor structure further includes a recess disposed to a partial region of the first conductive type semiconductor layer through the second conductive type semiconductor layer and the active layer, the first electrode is disposed in the recess, and the reflective layer and the second electrode are disposed to surround the recess.

7. The semiconductor device of claim 1, wherein
the first sub-layer is disposed on a portion of the bottom surface of the second sub-layer, a side surface of the first sub-layer is in contact with the bottom surface of the second sub-layer, the second electrode is disposed below the first sub-layer, and the reflective layer is disposed to be in contact with a side surface and a bottom surface of the second electrode.

8. The semiconductor device of claim 1, further comprising:
a first insulating layer disposed below the semiconductor structure and the reflective layer;

a first conductive layer electrically connected to the first electrode;

a second conductive layer disposed above the first conductive layer and electrically connected to the reflective layer;

a second insulating layer disposed between the first conductive layer and the second conductive layer;

a bonding layer disposed below the second conductive layer; and a substrate disposed below the bonding layer.

9. The semiconductor device of claim 1, wherein the reflective layer extends toward the bottom surface of the second sub-layer from a bottom surface of the first sub-layer.

10. The semiconductor device of claim 1, wherein the reflective layer is in contact with a side surface of the first sub-layer and surrounds the first sub-layer.

* * * * *